US009929166B1

(12) United States Patent
Sakuma et al.

(10) Patent No.: US 9,929,166 B1
(45) Date of Patent: Mar. 27, 2018

(54) SEMICONDUCTOR DEVICE

(71) Applicant: Toshiba Memory Corporation, Minato-ku (JP)

(72) Inventors: Kiwamu Sakuma, Yokkaichi (JP); Masumi Saitoh, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/442,274

(22) Filed: Feb. 24, 2017

(30) Foreign Application Priority Data

Sep. 12, 2016 (JP) .................................. 2016-177846

(51) Int. Cl.
| H01L 27/115 | (2017.01) |
| H01L 27/11524 | (2017.01) |
| H01L 29/788 | (2006.01) |
| H01L 29/792 | (2006.01) |
| H01L 29/10 | (2006.01) |
| H01L 29/49 | (2006.01) |
| H01L 27/1157 | (2017.01) |
| H01L 27/11551 | (2017.01) |
| H01L 27/11578 | (2017.01) |

(52) U.S. Cl.
CPC .... H01L 27/11524 (2013.01); H01L 27/1157 (2013.01); H01L 27/11551 (2013.01); H01L 27/11578 (2013.01); H01L 29/1033 (2013.01); H01L 29/4975 (2013.01); H01L 29/788 (2013.01); H01L 29/792 (2013.01)

(58) Field of Classification Search
CPC .......... H01L 27/11524; H01L 27/11578; H01L 27/11551; H01L 27/1157; H01L 29/1033; H01L 29/792; H01L 29/788; H01L 29/4975

See application file for complete search history.

(56) References Cited

U.S. PATENT DOCUMENTS

| 7,936,004 B2 | 5/2011 | Kito et al. |
| 8,148,769 B2 | 4/2012 | Kito et al. |
| 8,188,530 B2 | 5/2012 | Tanaka et al. |

(Continued)

FOREIGN PATENT DOCUMENTS

| JP | 2007-266143 | 10/2007 |
| JP | 2011-9328 | 1/2011 |

(Continued)

*Primary Examiner* — Bitew Dinke
(74) *Attorney, Agent, or Firm* — Oblon, McClelland, Maier & Neustadt, L.L.P.

(57) ABSTRACT

The semiconductor device according to the embodiments comprises: a plurality of first conductive layers arranged in a first direction above a substrate, the first direction intersecting an upper surface of the substrate; a semiconductor layer that faces a side surface of the plurality of first conductive layers and extends in the first direction as a longitudinal direction thereof; a wiring portion configured by causing end portions of the first conductive layers to be at different positions, respectively; and a transistor located above the wiring portion. The transistor comprises: a channel portion arranged at a same height as a second conductive layer, the second conductive layer being one of the plurality of the first conductive layers; a gate insulating film arranged on an upper surface of the channel portion; and a gate electrode layer arranged on an upper surface of the gate insulating film.

19 Claims, 25 Drawing Sheets

(56) References Cited

U.S. PATENT DOCUMENTS

| | | |
|---|---|---|
| 8,378,409 B2 | 2/2013 | Park |
| 8,559,220 B2 | 10/2013 | Yamazaki et al. |
| 8,786,003 B2 | 7/2014 | Iwase et al. |
| 9,595,535 B1* | 3/2017 | Ogawa .............. H01L 27/11582 |
| 9,806,202 B2 | 10/2017 | Yamazaki et al. |
| 2011/0180866 A1* | 7/2011 | Matsuda ........... H01L 27/11573 257/324 |
| 2011/0260231 A1* | 10/2011 | Liang ...................... H01L 21/84 257/307 |
| 2012/0238093 A1* | 9/2012 | Park .................. H01L 21/76838 438/675 |
| 2012/0273965 A1* | 11/2012 | Seo .................. H01L 27/11565 257/774 |
| 2013/0100741 A1* | 4/2013 | Choi ................. H01L 27/11565 365/185.18 |
| 2013/0113033 A1* | 5/2013 | Choi ................. H01L 29/66833 257/324 |
| 2013/0334591 A1* | 12/2013 | Matsuda ........... H01L 29/66833 257/324 |
| 2014/0061751 A1* | 3/2014 | Nakajima ............. H01L 27/088 257/314 |
| 2015/0243887 A1 | 8/2015 | Saitoh et al. |
| 2015/0262669 A1* | 9/2015 | Kamata .............. G11C 16/0483 365/185.05 |
| 2016/0141003 A1 | 5/2016 | Saitoh |
| 2016/0218224 A1 | 7/2016 | Ota et al. |
| 2016/0268304 A1* | 9/2016 | Ikeda ................ H01L 27/11582 |
| 2017/0077230 A1 | 3/2017 | Ikeda et al. |
| 2017/0271364 A1* | 9/2017 | Sakuma ........... H01L 27/11582 |
| 2017/0294443 A1* | 10/2017 | Kim .................. H01L 27/11565 |

FOREIGN PATENT DOCUMENTS

| | | |
|---|---|---|
| JP | 2011-135065 | 7/2011 |
| JP | 2012-248823 | 12/2012 |
| JP | 2013-55142 | 3/2013 |
| JP | 2015-159260 | 9/2015 |
| JP | 2016-100387 | 5/2016 |
| JP | 2016-134578 | 7/2016 |
| JP | 2016-171243 | 9/2016 |
| JP | 2017-59607 A | 3/2017 |
| JP | 2017-168759 A | 9/2017 |
| TW | 201017830 A1 | 5/2010 |
| TW | 201624708 A | 7/2016 |

* cited by examiner

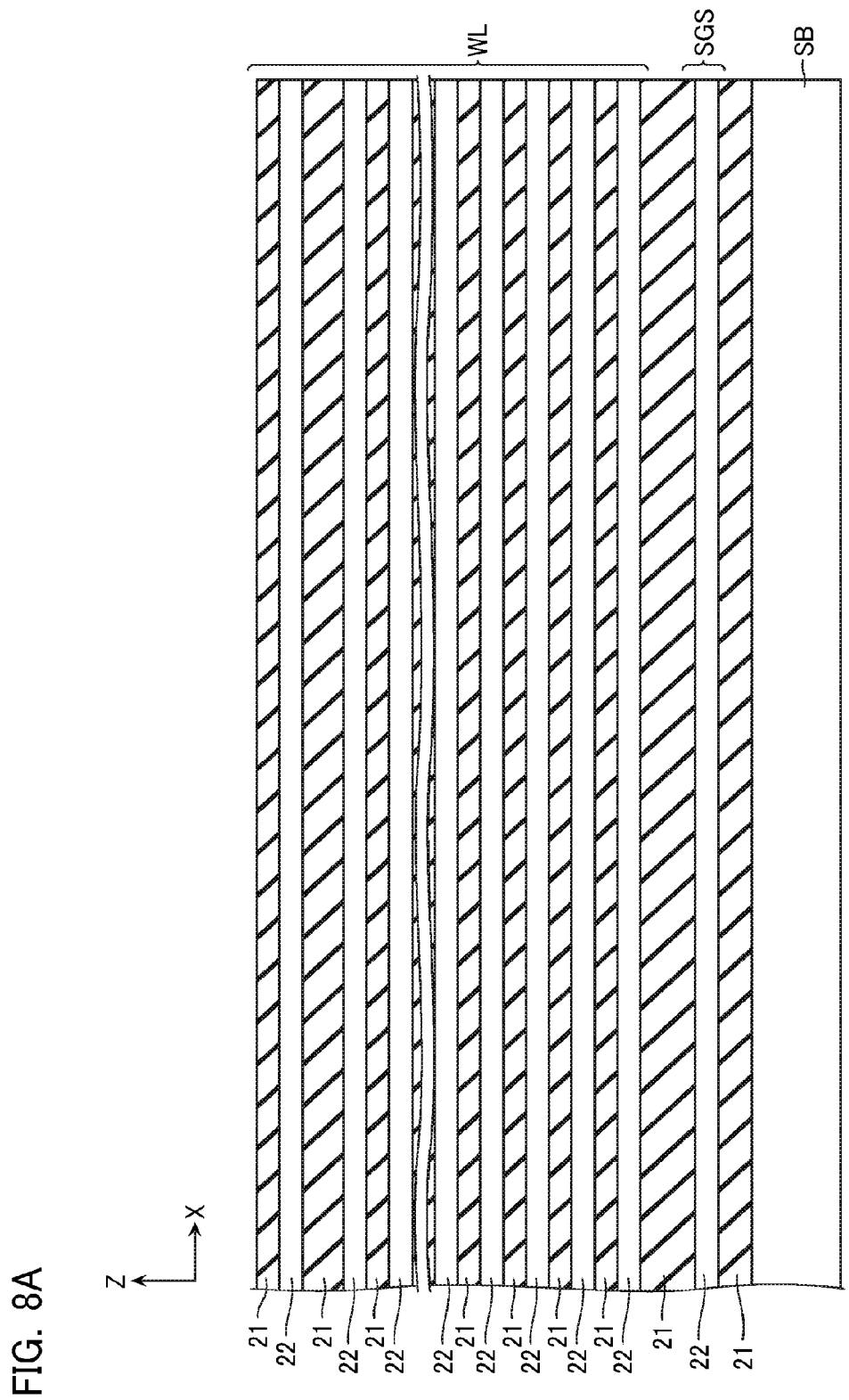

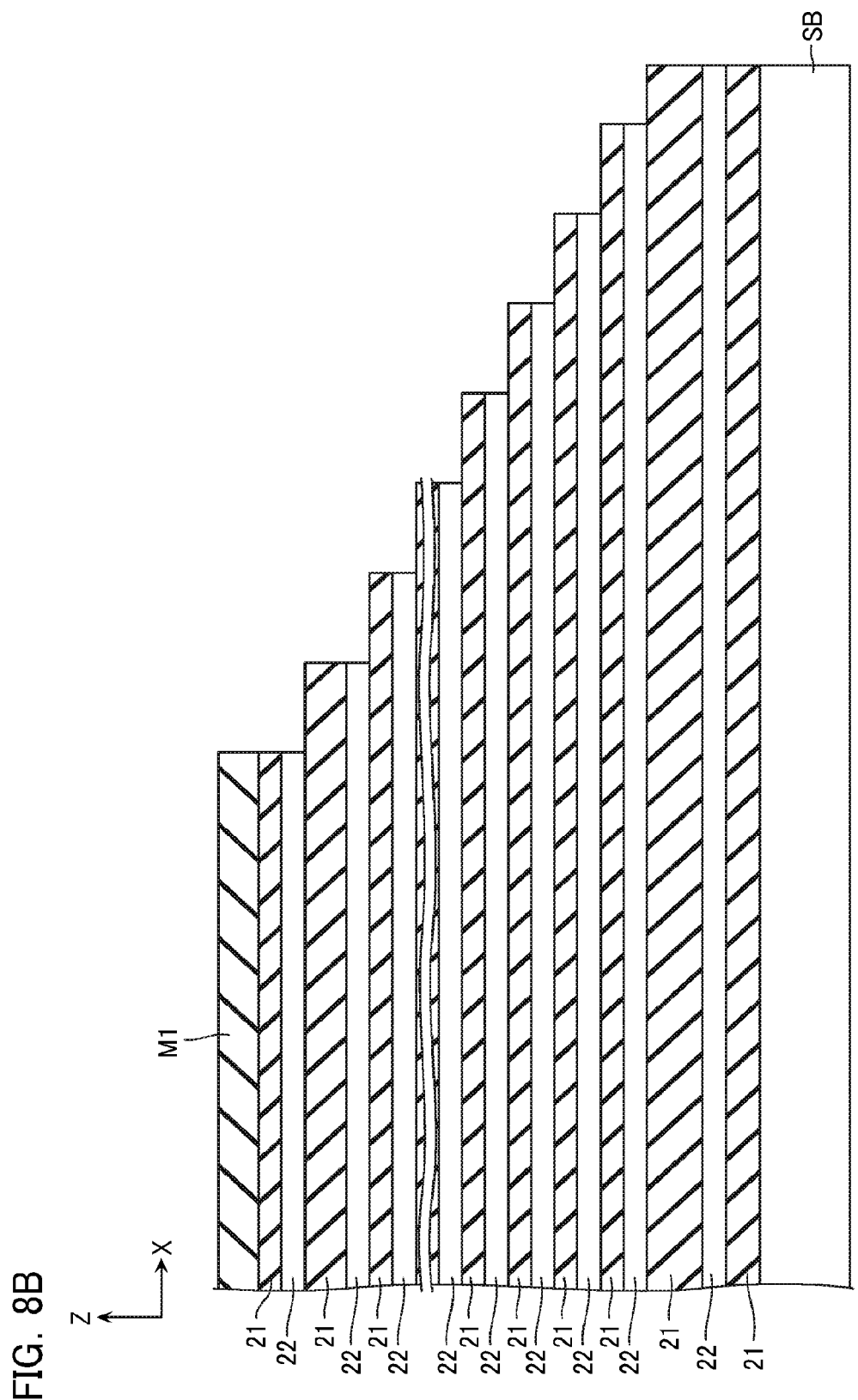

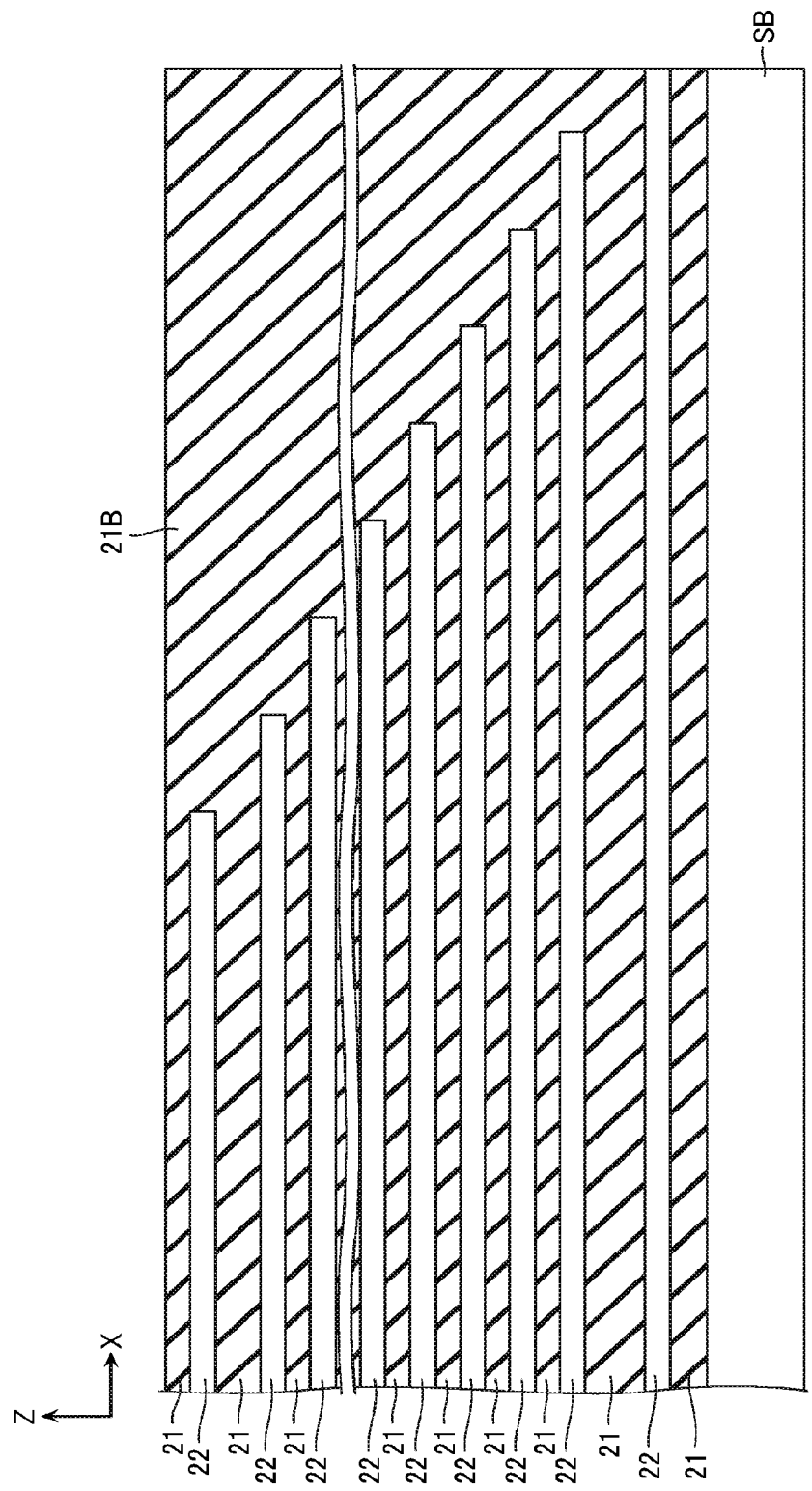

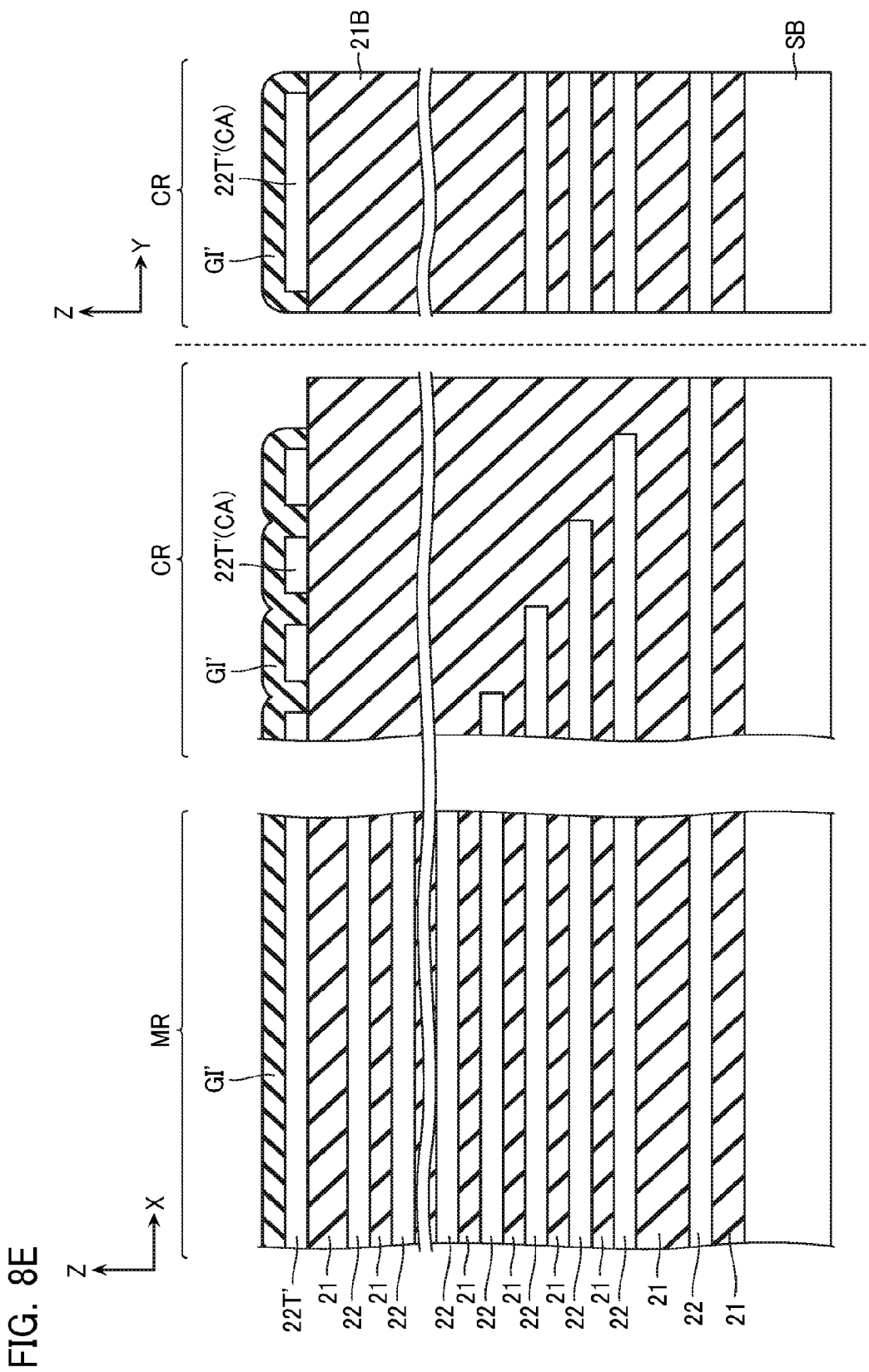

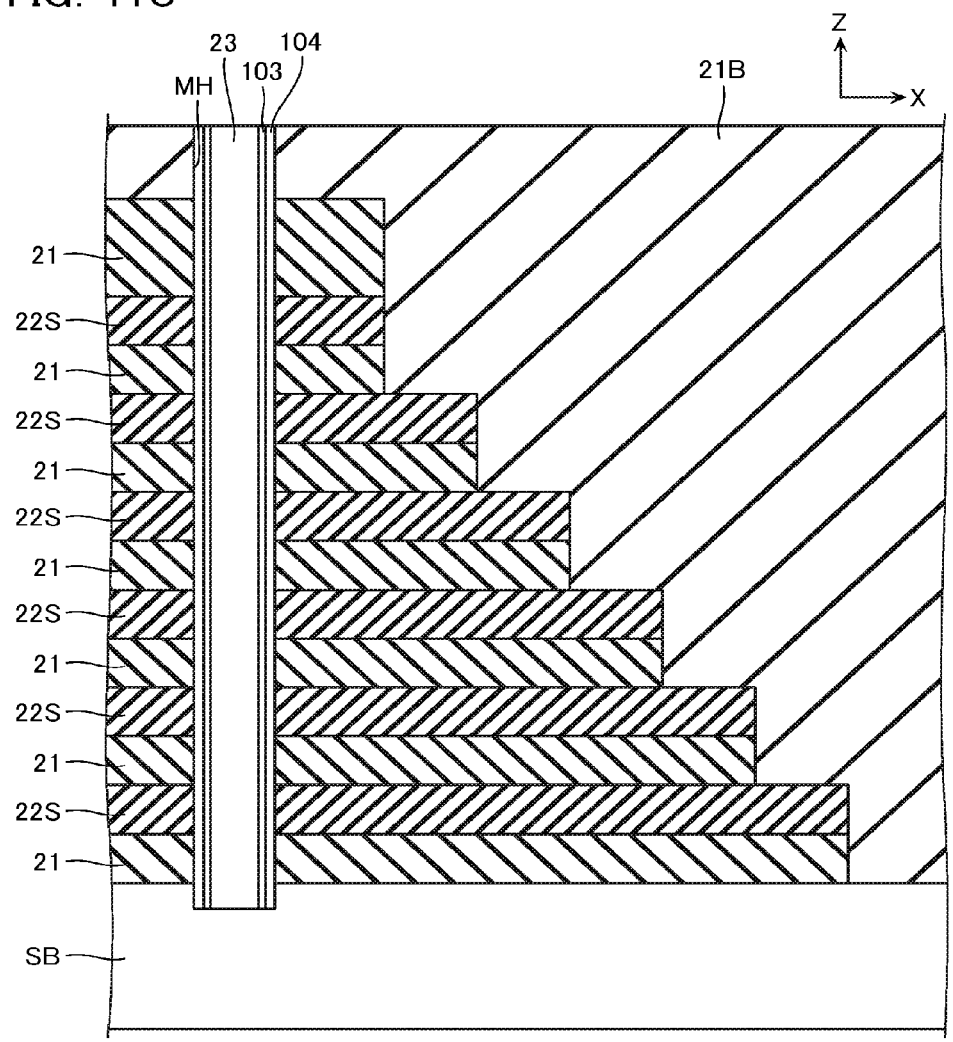

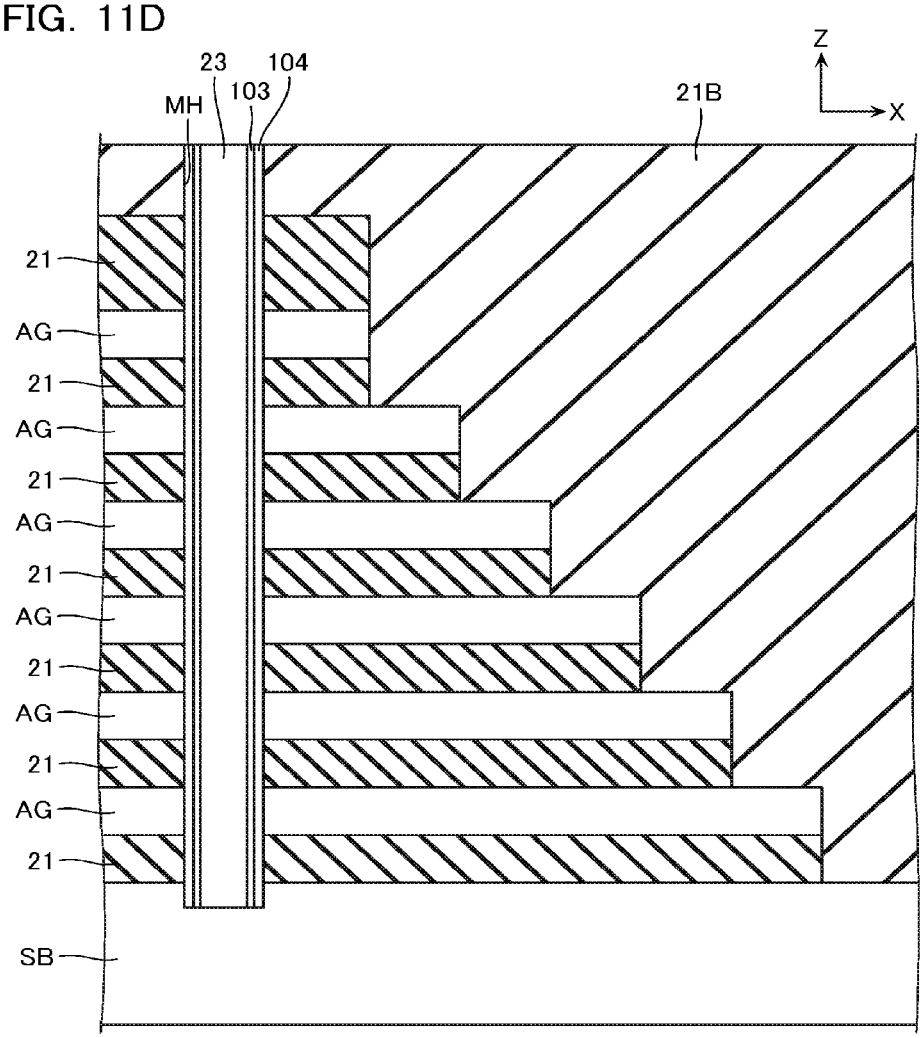

_US 9,929,166 B1_

SEMICONDUCTOR DEVICE

CROSS REFERENCE TO RELATED APPLICATIONS

This application is based on and claims the benefit of priority from prior Japanese Patent Application No. 2016-177846, filed on Sep. 12, 2016, the entire contents of which are incorporated herein by reference.

FIELD

Embodiments described hereinbelow relate to a semiconductor device.

BACKGROUND

Flash memory is known as one of semiconductor memory devices. Specifically, NAND type flash memory is widely used because of its low cost large capacity.

In addition, many techniques have been proposed for further increasing the capacity of NAND type flash memory. One of the techniques includes a structure where memory cells are arranged three-dimensionally. In a semiconductor memory device of such a three-dimensional type, memory cells are arranged along a certain direction. Conductive layers extend in a direction that is parallel to a substrate, from the memory cells arranged along the certain direction, respectively, and are laminated in a direction perpendicular to the substrate.

In such a semiconductor memory device of a three-dimensional type, increasing the number of the lamination of the memory cells and the conductive layers leads to increase in number of transistors for connecting the memory cells and the external circuit. This may cause increase in the occupation area of the transistors. Accordingly, it is requested that the occupation area of the transistors be reduced.

BRIEF DESCRIPTION OF THE DRAWINGS

FIG. 8A is a process chart that explains a method of manufacturing the semiconductor memory device 100 according to the first embodiment.

FIG. 8B is a process chart that explains a method of manufacturing the semiconductor memory device 100 according to the first embodiment.

FIG. 8C is process chart that explains a method of manufacturing the semiconductor memory device 100 of the first embodiment.

FIG. 8E is a process chart that explains a method of manufacturing the semiconductor memory device 100 according to the first embodiment.

FIG. 11C is a process chart that explains a method of manufacturing the semiconductor memory device 100 according to the second embodiment.

FIG. 11D is a process chart that explains a method of manufacturing the semiconductor memory device 100 according to the second embodiment.

DETAILED DESCRIPTION

The semiconductor device according to the embodiments described hereinbelow comprises: a plurality of first conductive layers arranged in a first direction above a substrate, the first direction intersecting an upper surface of the substrate; a semiconductor layer that faces a side surface of the plurality of first conductive layers and extends in the first direction as a longitudinal direction thereof; a wiring portion configured by causing end portions of the first conductive layers to be at different positions, respectively; and a transistor located above the wiring portion. The transistor comprises: a channel portion arranged at a same height as a second conductive layer, the second conductive layer being one of the plurality of the first conductive layers; a gate insulating film arranged on an upper surface of the channel portion; and a gate electrode layer arranged on an upper surface of the gate insulating film.

The semiconductor memory device according to the embodiments will be described hereinafter with reference to the accompanying drawings. Here, these embodiments are only examples, and do not intend to limit the scope of the present invention. The respective drawings of the semiconductor memory devices used in the following embodiments are schematically illustrated, and the thickness, the width, the ratio, and a similar parameter of the layer are different from actual parameters.

The following embodiments relate to a nonvolatile semiconductor memory device in a structure where a plurality of metal-oxide-nitride-oxide-semiconductor (MONOS) type memory cells (transistors) are disposed in a height direction. The MONOS type memory cell includes: a semiconductor film disposed in a columnar shape perpendicular to the substrate as a channel, and a gate electrode film disposed on the side surface of the semiconductor film via an electric charge accumulating layer. However, these embodiments are applicable to a semiconductor memory device having another type, for example, a semiconductor-oxide-nitride-oxide-semiconductor type (SONOS) memory cell. In addition, these embodiments are applicable to a floating-gate type memory cell.

First Embodiment

Figure 1:
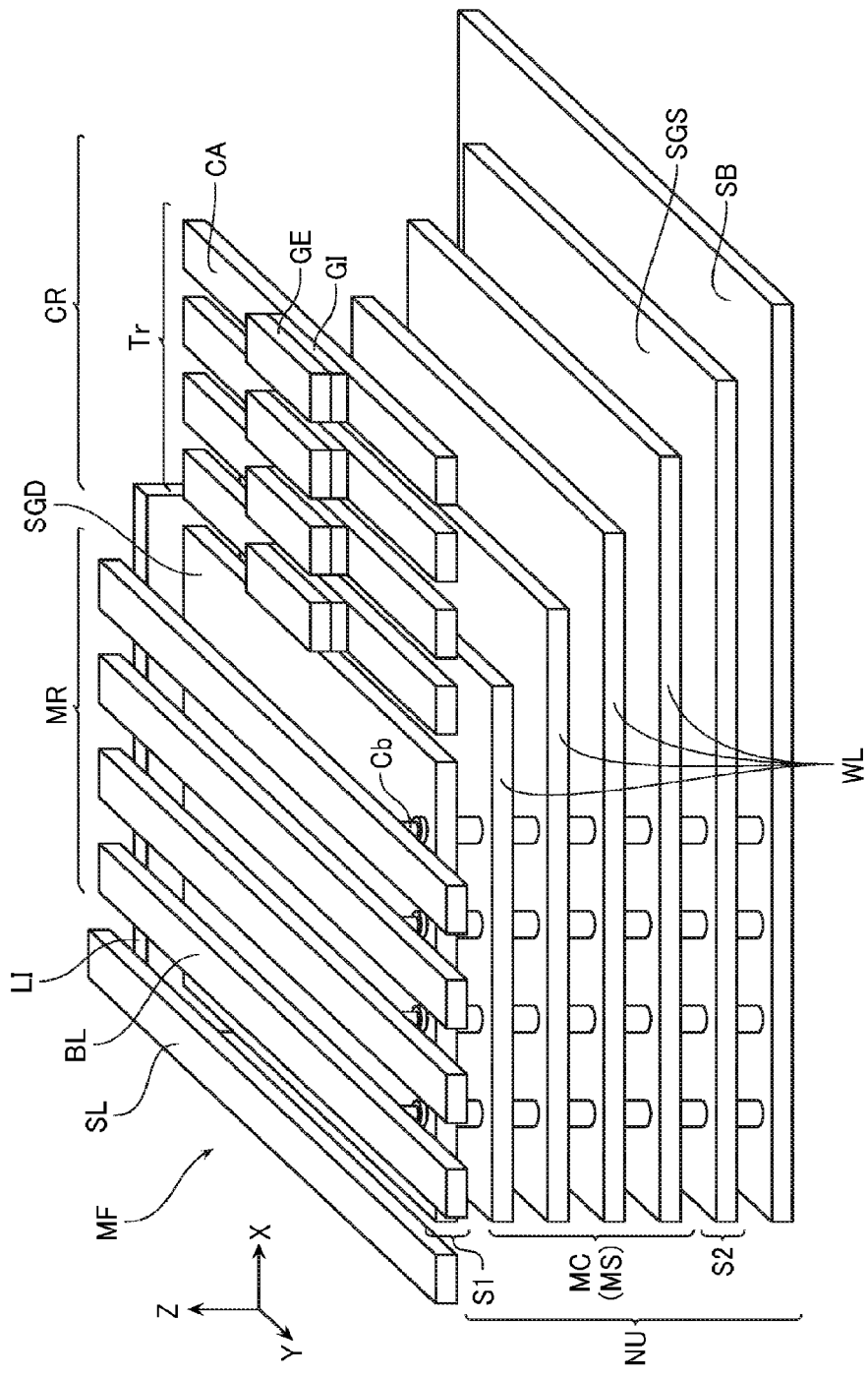
FIG. 1 is a perspective diagram that schematically illustrates an example of the structure of the nonvolatile semiconductor memory device 100 according to the first embodiment.

FIG. 1 is a perspective diagram that schematically illustrates an example of the structure of a nonvolatile semiconductor memory device 100 according to the first embodiment. The nonvolatile semiconductor memory device 100 includes a memory cell array MR, word lines WL, source side select gate lines SGS, drain side select gate lines SGD, bit lines BL, a source line SL, a stepwise wiring portion CR, and a peripheral transistor Tr. Note that FIG. 1 schematically illustrates one memory finger MF included in the memory cell array MR.

The memory cell array MR includes a memory string MS, a drain a side select transistor S1, and a source side select transistor S2. The memory string MS includes a plurality of memory cells MC (memory transistors) that are series-connected on a substrate SB. The drain side select transistor S1 and the source side select transistor S2 are connected to the both ends of the memory string MS, respectively. The memory string MS, and the drain side select transistor S1 and the source side select transistor S2 connected to the both ends thereof are referred to as "a NAND cell unit NU" hereinbelow.

As will be described below, the memory cell MC has a structure in which a control gate electrode (a word line WL) is provided on the side surface of a columnar semiconductor film that serves as a channel, via a memory layer including a charge accumulation layer. The drain side select transistor S1 and the source side select transistor S2 each has a structure in which a select gate electrode (the drain side select gate line SGD, the source side select gate line SGS) is provided on the side of the columnar semiconductor film, via a memory layer including a charge accumulation layer. FIG. 1 exemplifies a case in which four memory cells MC are provided in one memory string MS, for simplification of the drawings. However, it goes without saying that the number of the memory cells MC in one memory string MS is not limited to four.

As shown in FIG. 1, the word lines WL are connected in common to a plurality of the memory strings MS that are adjacent in the X direction (wordline direction) and in the Y direction (bitline direction) in one memory finger MF. In addition, the source side select gate line SGS is connected in common to a plurality of the source side select gate transistors S2 that are adjacent in the X direction and in the Y direction in one memory finger MF. Similarly, the drain side select gate line SGD is connected in common to a plurality of the drain side select gate transistors S1 that are adjacent in the X direction and in the Y direction in one memory finger MF. It is noted that the source side select gate line SGS and the drain side select gate line SGD may be collectively and simply referred to as "a select gate line". In addition, the drain side select transistor S1 and the source side select transistor S2 may be collectively and simply referred to as "a select transistor".

Among the memory cells MC in the memory string MS, one or more memory cells MC that are adjacent to the source side select gate line SGS and the drain side select gate line SGD may be dealt as dummy cells which are not used for storing data. The dummy cells may be two or more. Instead, the dummy cells may be omitted.

The bit lines BL are arranged to extend in the Y direction (bitline direction) that intersects the X direction (wordline direction). The Y direction is a longitudinal direction of the bit lines BL. The bit lines BL are arranged in the X direction at a certain pitch.

The bit line BL is connected to the plurality of memory string MS via the drain side select transistors S1. The source line SL is arranged having its longitudinal direction along the Y direction. The source line SL is connected to the substrate SB via a source line contact LI. This allows the source line SL to be connected to the memory string MS via the source line contact LI, the substrate SB and the source side select transistor S2.

Although illustration thereof is omitted, as circuits to control the voltages of the word line WL, the source line SL, the drain side select gate line SGD, the source side select gate line SGS, various types of control circuits are provided. In addition, a sense amplifier circuit is provided as a circuit to amplify a signal (a voltage) read to the bit line BL from a selected memory cell.

At least some of the above-mentioned various control circuits may be connected to the word line WL, the bit line BL, and the select gate lines SGD and SGS via the peripheral transistor Tr shown in FIG. 1. The peripheral transistor Tr is arranged at an upper side (Z direction) of the stepwise wiring portion CR. The peripheral transistor Tr is a thin-film transistor (TFT) having a structure in which a channel portion CA, a gate insulating film GI, and a gate electrode layer GE are sequentially stacked from the lower side in the Z direction (a side that is closed to the substrate SB).

The channel portion CA is composed of a semiconductor material such as polysilicon, for example, and the gate insulating film GI is formed of an insulating film such as a silicon oxide film, for example. In addition, the gate electrode layer GE is composed of a conductive film such as titanium silicide, for example. Note that, in FIG. 1, the gate electrode layer GE is provided independently for each of the plurality of peripheral transistors Tr. This is merely an example. Regarding to a plurality of the peripheral transistors Tr which can be turned on at the same time, these transistors may be connected to the same gate electrode layer GE.

The above-mentioned channel portion CA is composed of a material which are the same as that of the drain side select gate line SGD. Its thickness in the Z direction is made almost the same as the thickness of the drain side select gate line SGD in the Z direction. In addition, the position in the Z direction of the channel portion CA is generally the same as that of the drain side select gate line SGD.

The stepwise wiring portion CR is a wiring portion to connect the word lines WL, and the select gate lines SGD, SGS to contacts. The word lines WL, and the select gate lines SGS, SGD have a structure in which they are processed in a stepwise manner, such that the word lines WL, and the select gate lines SGS, SGD may be connected to the contacts independently at the upper surfaces thereof.

The upper surfaces of the ends of these wirings processed in a step-like manner serve as a contact connecting area. Although illustration is omitted in FIG. 1, contact plugs extend from the upper surface of the contact connecting area. These contact plugs are connected to the above-mentioned peripheral transistors Tr, via upper layer wirings and other contact plugs which are not shown in the drawings.

Although the stepwise wiring portion CR is illustrated only at the X direction side of the memory cell array MR in FIG. 1, the stepped wiring region CR may be formed to surround the entire perimeter of the memory cell array MR including the Y direction side of the memory cell array MR.

Figure 2:
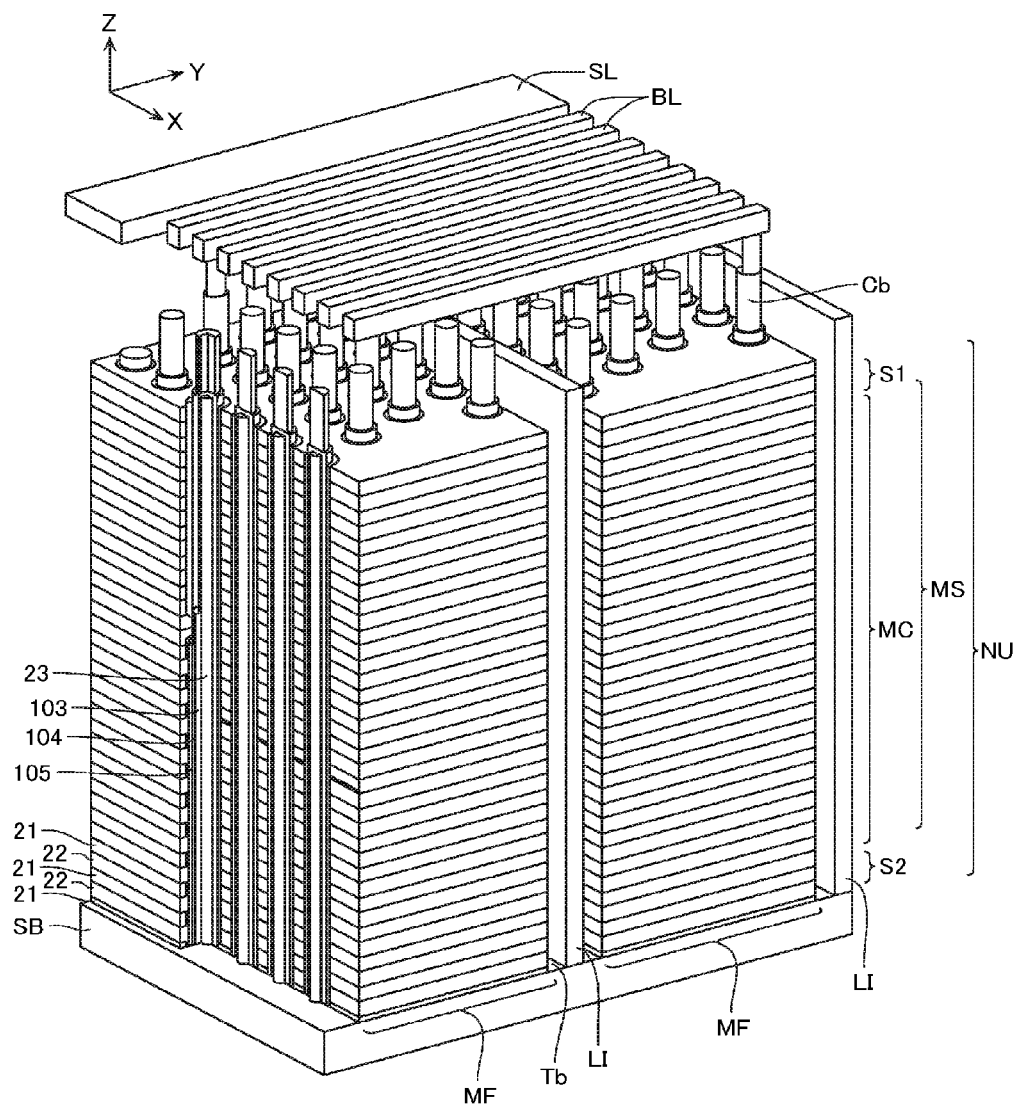
FIG. 2 is a perspective diagram showing a structure of the memory cell array MR of the first embodiment.
Figure 3:
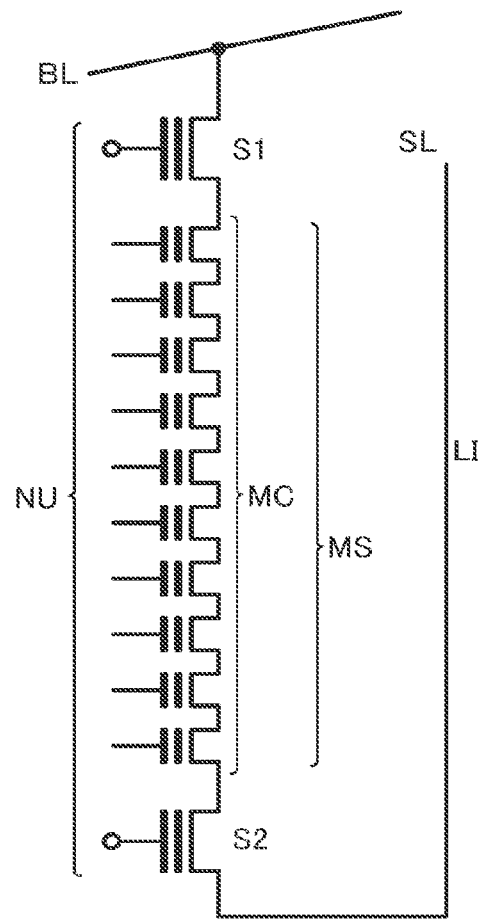
FIG. 3 is an equivalent circuit diagram of one NAND cell unit NU.
Figure 4:
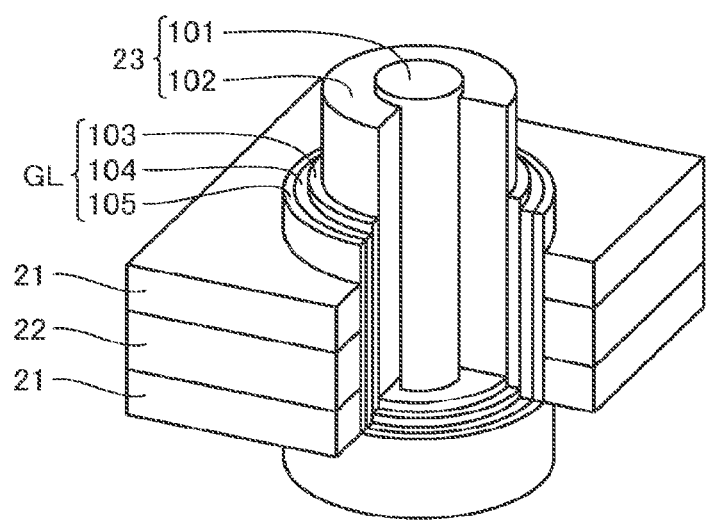
FIG. 4 is a perspective sectional view of one memory cell MC.

Next, the derailed structure of the memory cell array MR will be described with reference to FIG. 2 to FIG. 4. FIG. 2 is a perspective diagram illustrating a part of the structure of the memory cell array MR. FIG. 3 is an equivalent circuit diagram of one NAND cell unit NU. FIG. 4 is a perspective sectional view of one memory cell MC.

As shown in FIG. 2, the memory cell array MR has a structure in which interlayer insulating layers 21 and conductive layers 22 are alternately stacked on the semiconductor substrate SB, along the Z direction which is perpendicular to the upper surface of the substrate SB. These conductive layers 22 function as control gates of the memory cells MC (the word lines WL), the source side select gate line SGS, and the drain side select gate lines SGD. The interlayer insulating layers 21 are arranged between these conductive layers 22 to electrically insulate the conductive layers 22. The conductive layers 22 may be composed of the polysilicon that is doped with p-type impurities or n-type impurities (phosphorus or the like). Instead of polysilicon, a metallic material such as tungsten (W), tungsten nitride (WN), tungsten silicide (WSix), tantalum (Ta), tantalum nitride (TaN), tantalum silicide (TaSix), palladium silicide (PdSix), erbium silicide (ErSix), yttrium silicide (YSix), platinum silicide (PtSix), hafnium silicide (HfSix), nickel silicide (NiSix), cobalt silicide (CoSix), titanium silicide (TiSix), vanadium silicide (VSix), chromic silicide (CrSix), manganese silicide (MnSix), iron silicide (FeSix), ruthenium (Ru), molybdenum (Mo), titanium (Ti), titanium nitride (TiN), vanadium (V), chromium (Cr) manganese (Mn), iron (Fe), cobalt (Co), nickel (Ni), gold (Au) silver (Ag) or copper (Cu), or the compound of these materials may be used.

In addition, semiconductor layers 23 are arranged to penetrate the stacked body of the interlayer insulating layers 21 and the conductive layers 22. The semiconductor layers 23 has its longitudinal direction along the stacking direction (the Z direction in FIG. 2), and are arranged at certain pitches in the XY plane. Formed between the semiconductor layer 23 and the stacked body of the conductive layers 22 and the interlayer insulating layers 21 are a tunnel insulating layer 103, a memory layer 104 including a charge accumulation layer, and a block insulating layer 105. The memory layer 104 may be formed of a laminated structure of a charge accumulation layer such as a silicon nitride film and an oxide film such as silicon oxide film. Instead of using a silicon nitride film or the like in the memory layer 104, a floating gate structure using a conductive film may be employed.

A threshold voltage of the memory cell MC changes according to the amount of accumulation of charges to the charge accumulation layer. The memory cell MC holds data corresponding to this threshold voltage.

The semiconductor layer 23 functions as a channel region (a body) of the memory cells MC included in the NAND cell unit NU and a channel region of the select transistor S1 and S2. These semiconductor layers 23 are connected to the bit lines BL via contacts Cb. The bit lines BL has its longitudinal direction along the Y direction, and are arranged at a certain pitch in the X direction.

The lower end of the semiconductor layer 23 is electrically connected to the semiconductor substrate SB. The lower end of the semiconductor layer 23 is electrically connected to the source line SL via this substrate SB and a source contact LI described below.

Note that the stacked body of the interlayer insulating layers 21 and the conductive layers 22 in the memory cell array MR is divided into the above-mentioned memory fingers MF. A trench Tb is formed at the border of the division, and an interlayer insulating layer not illustrated is embedded in this trench Tb. In addition, the above-described source contact LI is formed to penetrate the interlayer insulating layer not illustrated. The source contact LI is connected to the semiconductor substrate SB at its lower end, and is connected to the source line SL at its upper end.

FIG. 3 is an equivalent circuit diagram of one NAND cell unit NU. In this memory cell array MR, one NAND cell unit NU includes a memory string MS, a drain side select transistor S1, and a source side select transistor S2. The memory string MS includes a plurality of memory cells MC. The drain side select transistor S1 is connected between the upper end of the memory string MS and the bit line BL. The source side select transistor S2 is connected between the lower end of the memory string MS and the source line SL. As described above, some of the memory cells among memory cells MC that are close to the select transistors S1 and S2 may be used as dummy cells.

An example of a specific structure of one memory cell MC will be shown in FIG. 4. The columnar semiconductor layer 23 includes an oxide film core 101, and a columnar semiconductor 102 that surrounds the periphery of the oxide film core 101. The oxide film core 101 may be formed of silicon oxide ($SiO_2$), for example. The columnar semiconductor 102 may be formed of silicon (Si), silicon germanium (SiGe), silicon carbide (SiC), germanium (Ge), or carbon (C). The columnar semiconductor 102 may be formed of a single layer, or two layers.

Formed around the columnar semiconductor 102 to surround the columnar semiconductor 102 are a tunnel insulating layer 103, a memory layer 104 including a charge accumulation layer, and a block insulating layer 105. The tunnel insulating layer 103 is formed of a silicon oxide film ($SiO_x$), for example, and serves as a tunnel insulating layer of the memory cell MC. The memory layer 104 includes a charge accumulation layer including a silicon nitride film ($Si_3N_4$), and has a function of trapping electrons injected from the columnar semiconductor 102 via the tunnel insulating layer 103 by a write operation. The block insulating layer 105 may be formed of a silicon oxide film, for example, The tunnel insulating layer 103, the memory layer 104 and the block insulating layer 105 are totally referred to as "a gate insulation layer GL". Although the gate insulation layer GL in FIG. 4 includes three layers, various kinds of structures that are different in the number of layers, the order of the layers, the material of the layers, and the like, may be considered. The gate insulating film GL necessarily includes a charge accumulation layer described above.

Note that, as the material of the tunnel insulating layer 103 and the block insulating layer 105, it is possible to use, in addition to a silicon oxide film ($SiO_x$), $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO, and the like.

Although in this example, the tunnel insulating layer 103, the memory layer 104 and the block insulating layer 105 are illustrated such that they are formed at the entire surface of the columnar semiconductor 102, the present invention is not limited to this example. It is possible that they are formed only on the side surface of the word lines WL.

In addition, at the periphery of the columnar semiconductor 102, the interlayer insulating layers 21 and the conductive layers 22 described above are alternately laminated to surround the columnar semiconductor layer 23, via the tunnel insulating layer 103, the memory layer 104 and the block insulating layer 105

Figure 5:
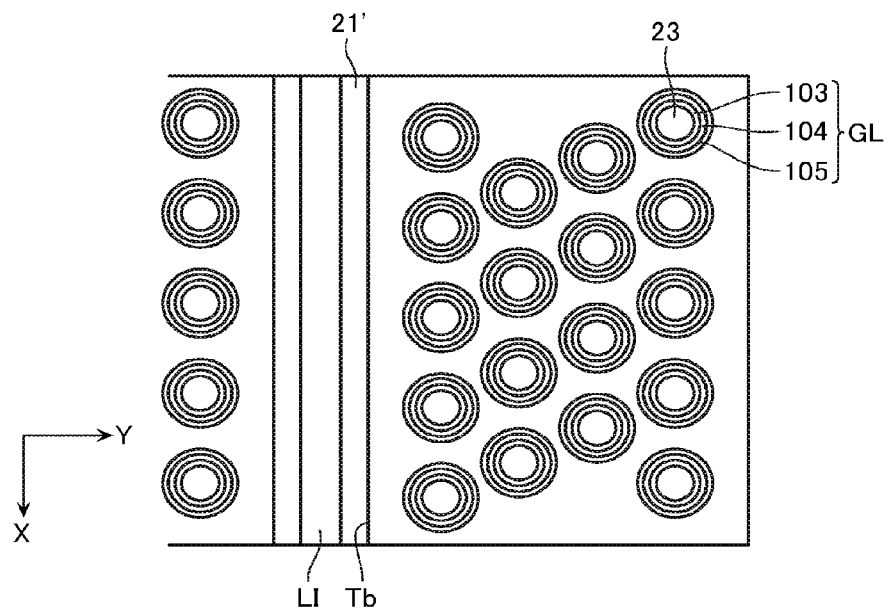
FIG. 5 a plan view showing a part of the memory cell array MR.

As shown in FIG. 5, which is a plan view of a part of the memory cell array MR, the semiconductor layers 23 (the columnar semiconductors 102) are arranged to be aligned in the oblique direction to the X direction (wordline direction) and the Y direction (bitline direction) thereby increasing the concentration of the semiconductor layers 23 arranged therein, and increasing the concentration of the memory cells MC arranged therein. One bit line BL that extends in the Y direction is connected to any one of the semiconductor layers 23 arranged in the oblique direction. This allows a bit line BL to be connected to only one memory string MS in a region sandwiched between two source contacts LI (a memory finger MF). This is merely an example, and it is possible to align the semiconductor layers 23 along the X direction and the Y direction. In addition, the source contact LI is formed to have a stripe shape having its longitudinal direction in the X direction. The source contact LI is embedded in the trench Tb via the interlayer insulating layer 21'.

Figure 6:
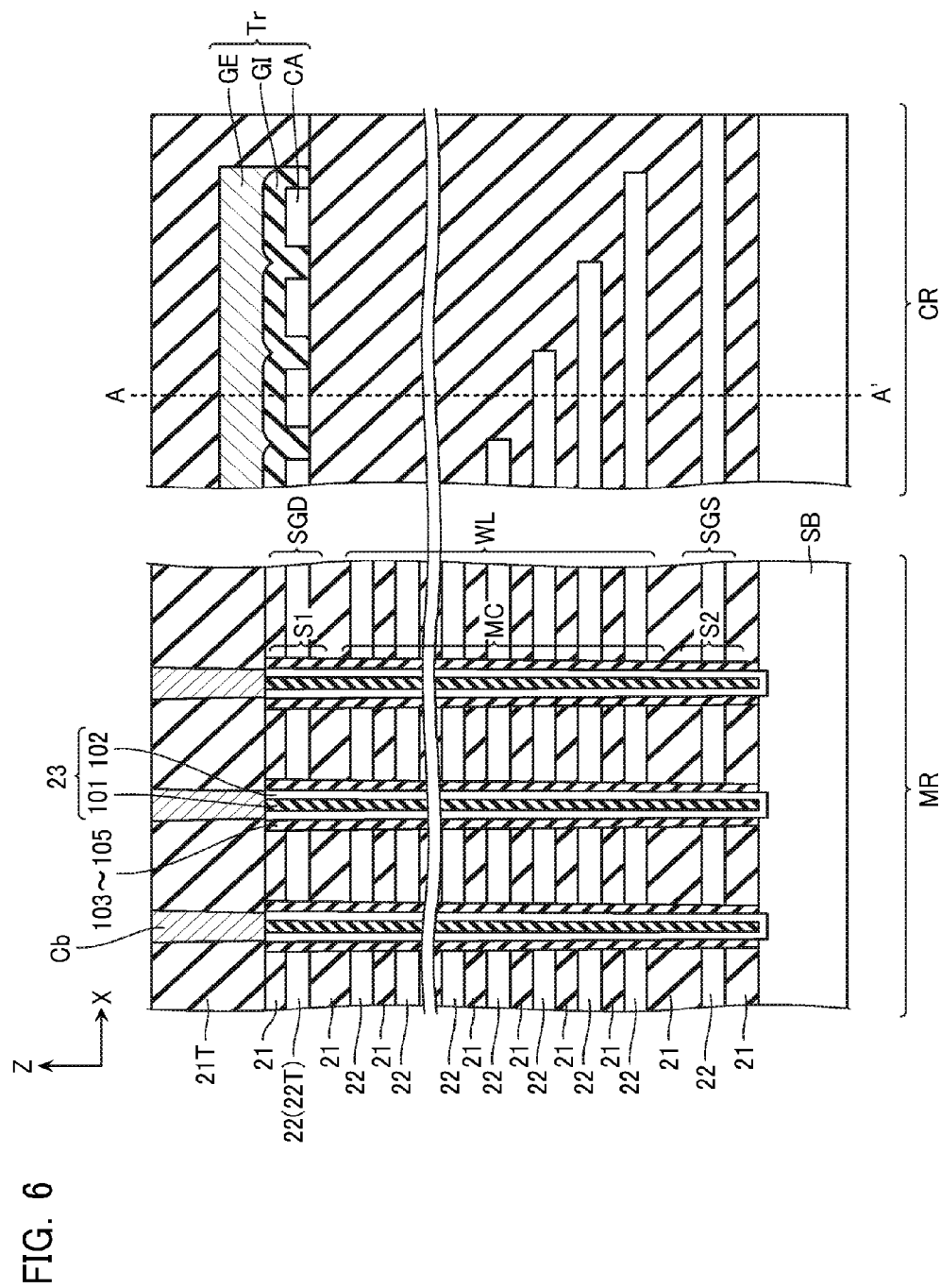
FIG. 6 is a sectional view illustrating a structure of the memory cell array MR of the first embodiment and the stepwise portion CR.
Figure 7:
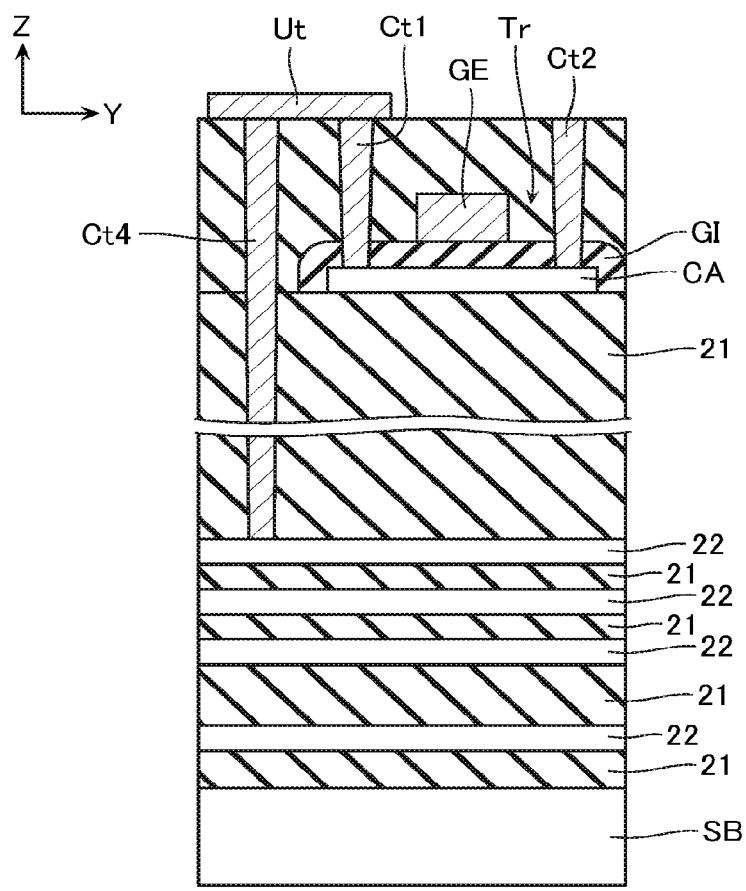
FIG. 7 is a plan view that illustrates arrangement of the transistors Tr.

FIG. 6 is a sectional view that describes the structure of the memory cell array MR and the stepwise wiring portion CR. FIG. 7 is A-A' sectional view of FIG. 6.

On the semiconductor substrate SB, the semiconductor layer 23 extends in a direction perpendicular to the substrate SB. The semiconductor layer 23 is formed to have its bottom in the substrate SB. The tunnel insulating layer 103, the memory layer 104 including a charge accumulation layer, and the block insulating layer 105 are formed on the side surface of the semiconductor layer 23 in this order. The tunnel insulating layer 103, the memory layer 104 including a charge accumulation layer, and the block insulating layer 105 are formed at a position higher than the surface of the substrate SB. In addition, a stacked body, in which the conductive layers 22 and the interlayer insulating layers 21 are stacked alternately, is formed around the semiconductor layer 23, via the tunnel insulating layer 103, the memory layer 104 and the block insulating layer 105.

Then, the semiconductor layer 23 is electrically connected to the substrate SB at its lower end. A conductive layer 22 that is at the highest layer among the plurality of the conductive layers 22 is hereinafter referred to as an uppermost layer conductive layer 22T. The uppermost conductive layer 22T is different from the other conductive layers 22 in its material, as will be described below. For example, the uppermost conductive layer 22T may include a silicide layer at its upper side, while the other conductive layers 22 may be conductive layers which do not include any silicide layers therein. Alternatively, They may be different in the types of metallic material that constitutes silicide.

Note that an interlayer insulating film 21T is deposited on the upper side of the uppermost conductive layer 22T. The contact plug Cb is formed to penetrate the interlayer insulating layer 21T and reach the columnar semiconductor 102.

As shown in FIG. 6, the stepwise wiring portion CR is formed such that the conductive layers 22 (the second conductive layer) and the interlayer insulating layers 21 extend from the memory cell array MR, and their ends are different from one another in position to have a step-like shape. As shown in FIG. 7, on the upper surface of the step-like part, contact plugs Ct4 are formed to extend in the z direction as its longitudinal direction.

As shown in FIG. 6 and FIG. 7, the peripheral transistor Tr includes the channel portion CA, the gate insulating film GI and the gate electrode layer GE.

The channel portion CA is arranged having its longitudinal direction along the Y direction. In other words, the channel portion CA is arranged having its longitudinal direction along the longitudinal direction of each of the step portions of the stepwise wiring portion CR. The plurality of the channel portions are arranged at the same height in the Z direction as the drain side select gate line SGD, and are arranged such that they are substantially parallel to one another.

The channel portion CA constitutes a body of the transistor Tr. The channel portion CA is a semiconductor layer for forming a channel by application of a voltage to the gate electrode layer GE. The upper surface of the channel portion CA is formed so that contact plugs Ct1 and Ct2 penetrate through the gate insulating film GI. The peripheral transistor Tr is connected to the stepwise wiring portion CR (the conductive layers 22) through the contact plug Ct1, an upper-layer wiring Ut, and the contact plug Ct4. The material of the channel portion CA is preferably single-crystalline silicon or polysilicon which is doped with certain impurities, for example.

Note that the example shown in FIGS. 6 and 7 shows a structure in which one gate electrode layer GE is formed across a plurality of the channel portions CA aligned in the X direction, thereby a plurality of the peripheral transistors Tr sharing one gate electrode layer GE. It is possible that, as shown in FIG. 1, the gate electrode layers GE are separately formed for each of the peripheral transistors Tr.

In addition, in the example of FIG. 7, the contact plugs Ct1 and Ct2 are arranged to reach the surface of the channel portion CA from the upper side of the channel portion CA. This structure is merely an example. The contact plugs Ct1 and Ct2 may penetrate through the channel portion CA to reach the conductive layer 22.

The gate insulating film GI is formed to cover the upper surface of the channel portion CA, and functions as a gate insulating film of the peripheral transistor Tr. The material of the gate insulating film GI may be a silicon oxide film ($SiC_2$) or a silicon nitride film (SiN). Metal oxide (e.g., $HfO_x$) may also be used.

The gate electrode layer GE is deposited on the upper surface of the gate insulating film GI, and functions as a gate electrode of the peripheral transistor Tr.

With reference now to FIGS. 8A-8I, a method of manufacturing the semiconductor memory device according to the first embodiment will be described.

Figure 8D:
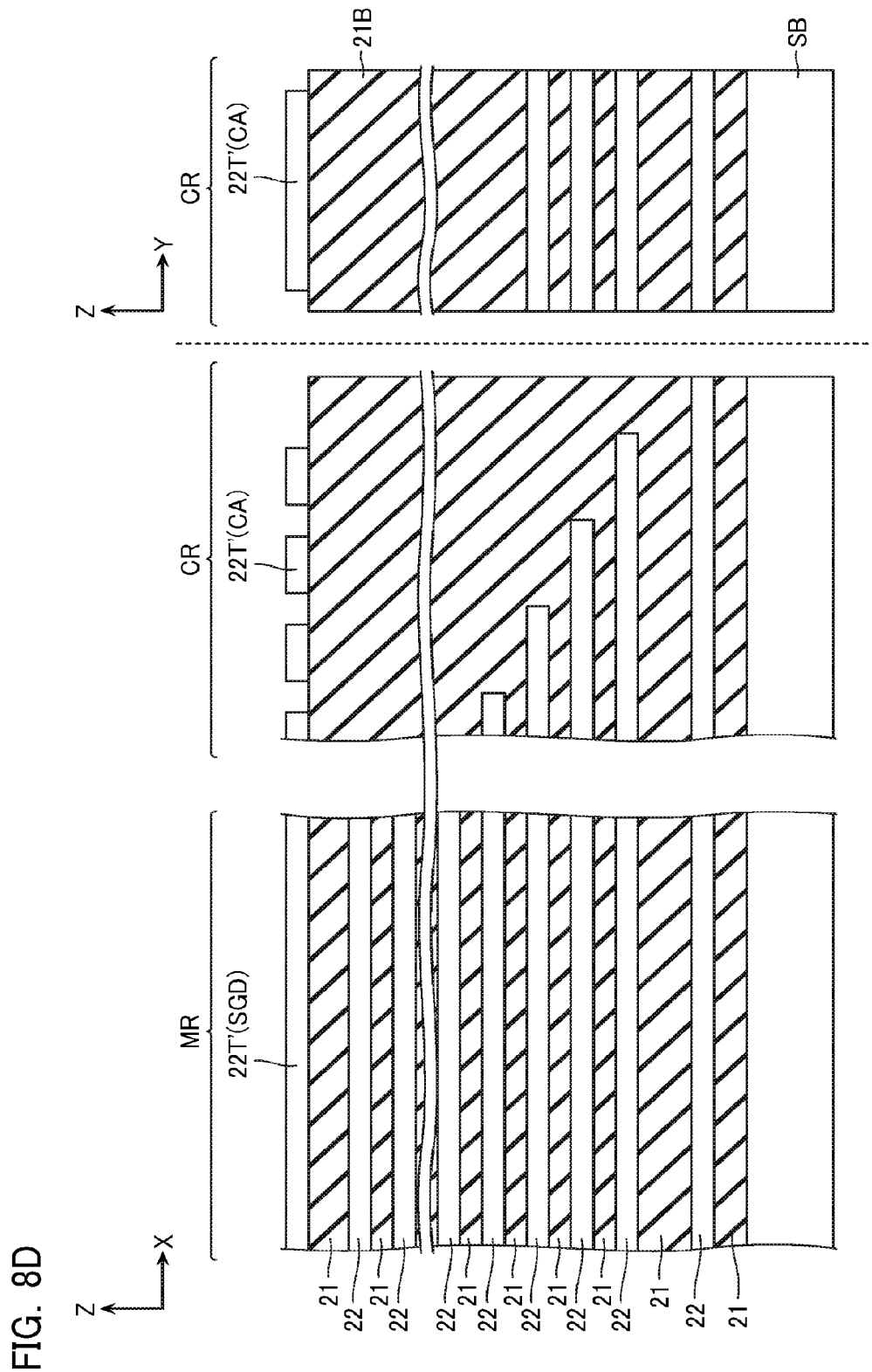
FIG. 8D is a process chart that explains a method of manufacturing the semiconductor memory device 100 according to the first embodiment.

FIG. 8A to FIG. 8C are Z-X sectional views showing a process of manufacturing the semiconductor memory device, and FIG. 8D to FIG. 8I are Z-X and Z-Y sectional views showing a process of manufacturing of the same device.

First, as shown in FIG. 8A, the interlayer insulating layer 21 are laminated on the semiconductor substrate SB, with the conductive layers 22 sandwiched therebetween. At this stage, the laminated conductive layers 22 include conductive layers that will become the word lines WL and the source side select gate line SGS, except for the drain side select gate line SGD.

Note that, a conductive layer 22T' that will become the drain side select gate line SGD is not deposited at this stage, but will be deposited in a later process.

Subsequently, as shown in FIG. 8B, after a resist M1 is deposited on the upper side of the stacked body of the conductive layers 22 and the interlayer insulating layers 21, a wet etching is performed while this resist M1 is subject to a slimming process by etching gradually. The ends of the conductive layers 22 and the interlayer insulating layers 21 are provided with a step-like shape, thereby the above-mentioned stepwise wiring region CR being formed.

Next, as shown in FIG. 8C, an interlayer insulating layer 21B is deposited to embed the stacked body of the conductive layers 22 and the interlayer insulating layers 21. The upper surface of interlayer insulating layer 21B is planarized by a CMP method (Chemical Mechanical Polishing).

Then, as shown in FIG. 8D, the conductive layer 22T' is deposited on the entire upper surface of the interlayer insulating layer 21 and 21B using polysilicon doped with p-type or n-type impurities, for example. This conductive layer 22T' is a film that will become the drain side select gate lines SGD and the channel portion CA described above.

The conductive layer 22T' is processed into a plate-like shape that corresponds to the shape of the memory finger MF at the position of the memory cell array MR, while it is processed into stripe shapes having a longitudinal direction along the Y direction and arranged along the X direction at the position of the stepwise wiring region CR.

Then, as shown in FIG. 8E, an insulating film GI' is deposited on the upper part of an included stacked body, including the upper surface of the conductive layer 22T' The insulating film GI' will become the above-mentioned gate insulating film GI in the stepwise wiring portion CR, while it will be removed in the memory cell array MR in a later process.

Note that it is possible that the gate insulating film GI is not removed in the memory cell array MR, and is used as an interlayer insulating layer. The insulating film GI' can be deposited by a chemical vapor deposition method (CVD method), using silicon oxide ($SiC_2$) or the like as its material.

Figure 8F:
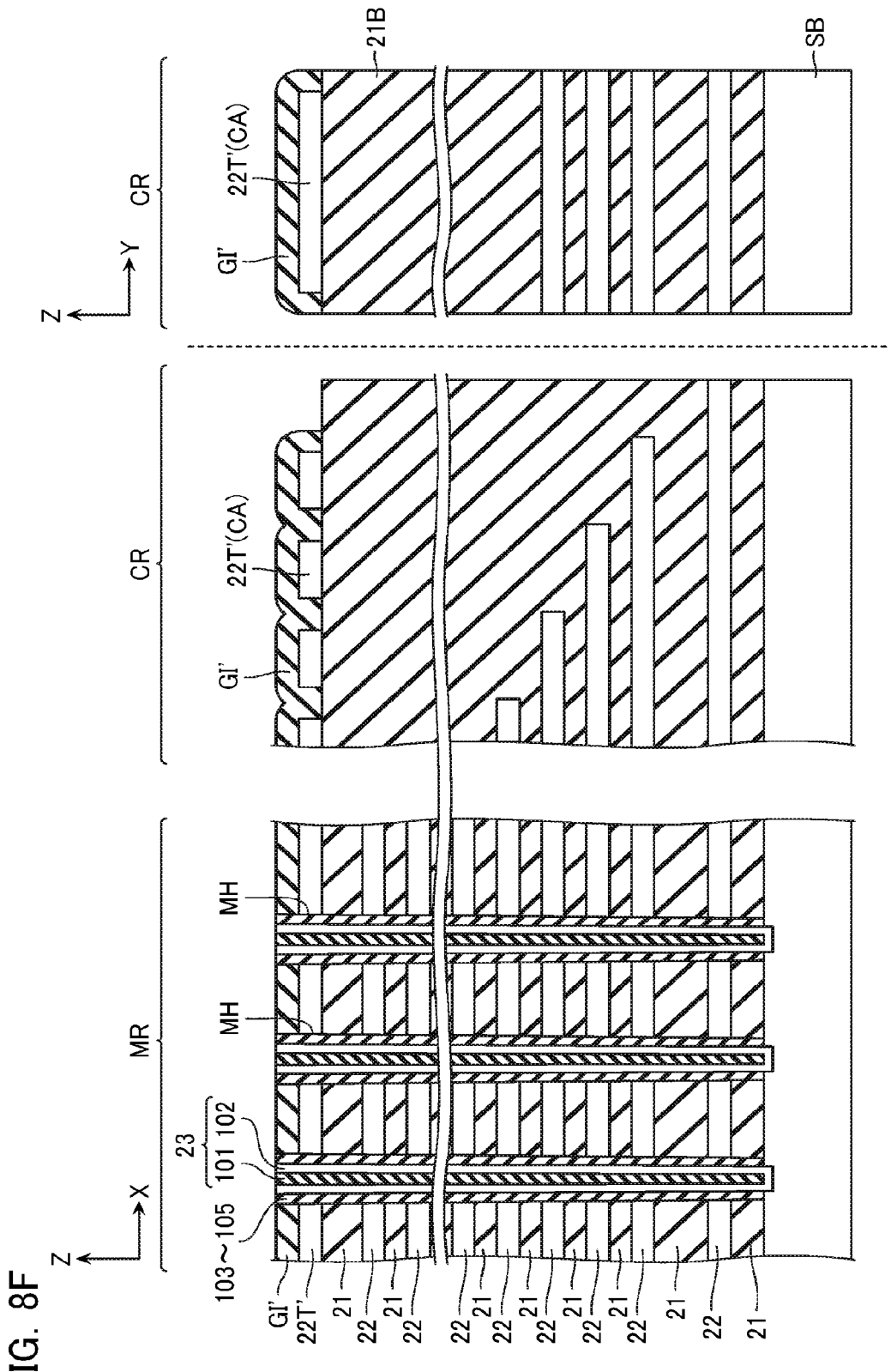
FIG. 8F is a process chart that explains a method of manufacturing the semiconductor memory device 100 according to the first embodiment.

Next, as shown in FIG. 8F, memory holes MH are formed using photolithography and etching techniques at a part where the memory cell array MR shall be formed. Then, the above-mentioned block insulating layer 105, the memory layer 104 and the tunnel insulating layer 103 are deposited on the sidewalls of the memory holes MH in this order, using plasma CVD or the like, to form the gate insulation layer GL.

Furthermore, the above-mentioned semiconductor layer 23 is formed to fill the inside of the memory holes MH to form the memory unit MU. The semiconductor layer 23 is formed by depositing amorphous silicon, and thereafter, crystallizing the amorphous silicon by a certain heat process to form polysilicon. The crystallized polysilicon becomes the above-mentioned columnar semiconductor 102. Silicon oxide ($SiO_2$) is embedded in the cavity which remained inside the columnar semiconductor 102. This silicon oxide becomes the above-mentioned oxide film core 101, thereby completing the semiconductor layer 23.

Figure 8G:
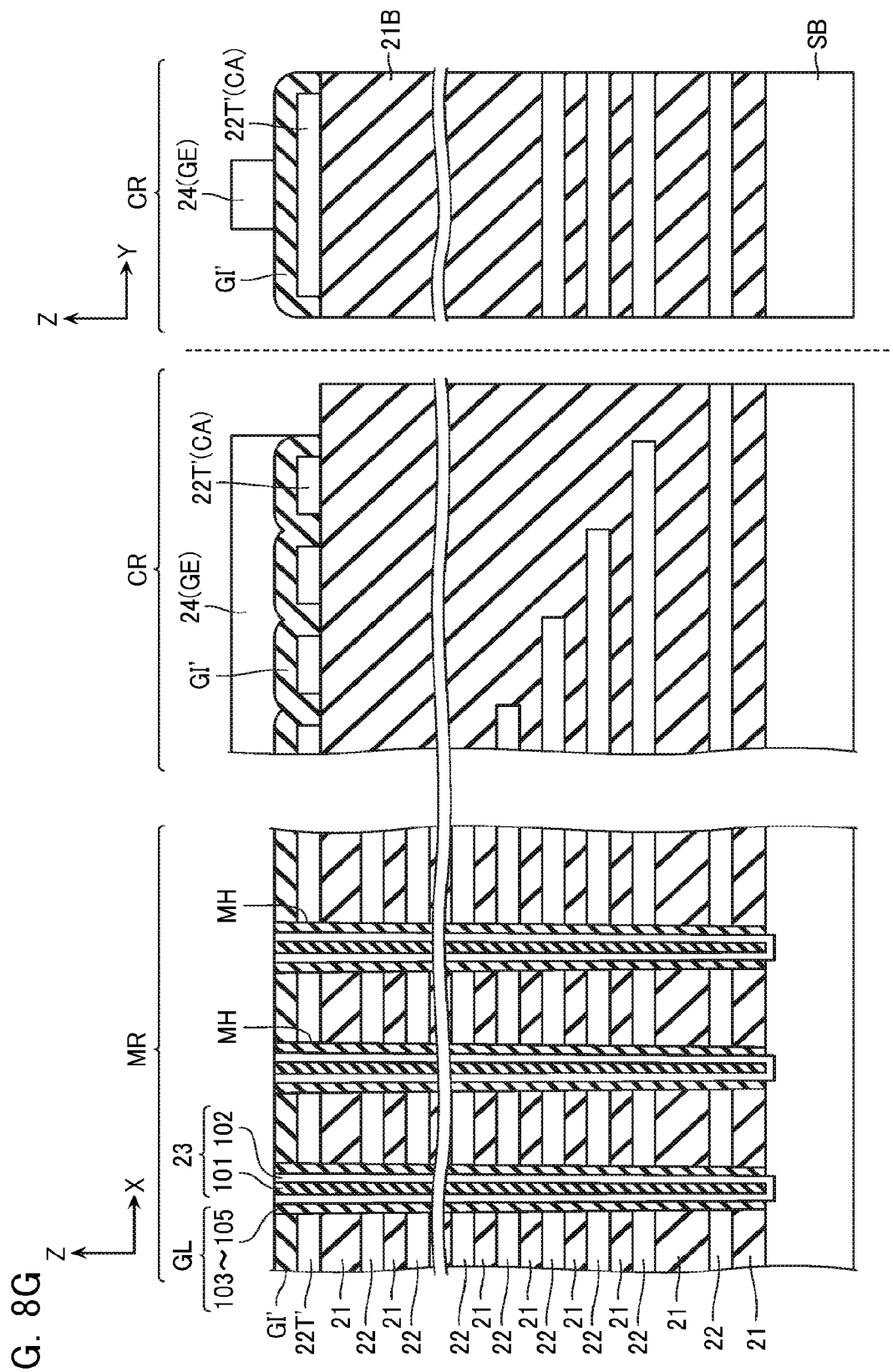
FIG. 8G is process chart that explains a method of manufacturing the semiconductor memory device 100 according to the first embodiment.

Then, as shown in FIG. 8G, a conductive layer 24 is formed on the entire surface of the insulating film GI' in the stepwise wiring portion CR, using a material such as polysilicon doped with impurities. Then, as shown in FIG. 8H, this conductive layer 24 is processed by photolithography and etching to form the gate electrode layer GE.

Figure 8H:
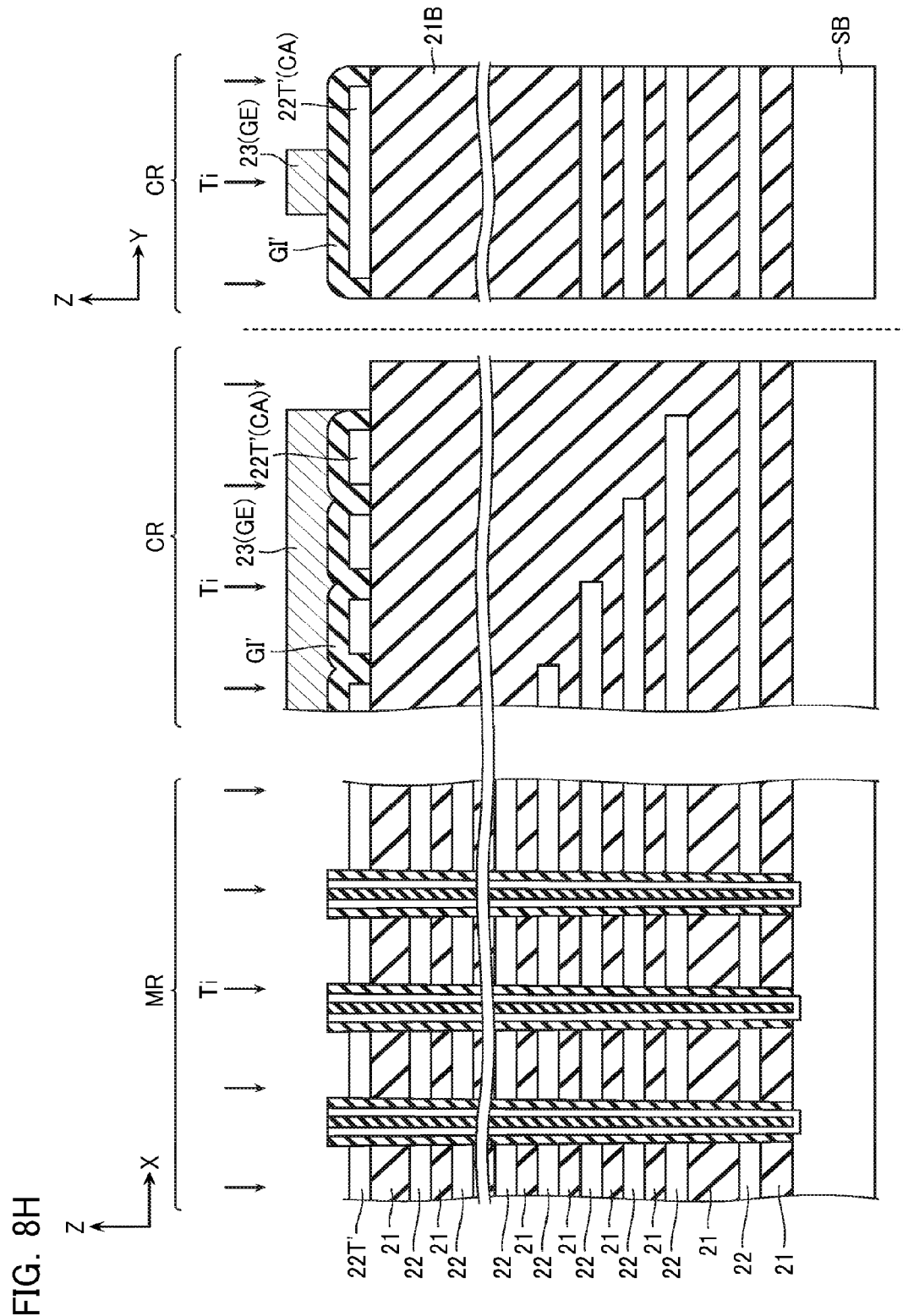
FIG. 8H is a process chart that explains a method of manufacturing the semiconductor memory device 100 according to the first embodiment.

Subsequently, as shown in FIG. 8H, after removing the insulating film GI' stacked in the memory cell array MR by etching, metal (silicide metal) such as titanium (Ti), cobalt (Co), tungsten (W), and nickel (Ni) is injected into the surface of the conductive layer 22T' and the conductive layer 24 by sputtering. Thereafter, a heat process is performed to forma silicide layer at least on the surface of the conductive layer 22T' including polysilicon and at least on the surface of the conductive layer 24. Note that it is possible to change the whole of the conductive layer 22T' and the conductive layer 24 to the a silicide layer (full silicide).

Figure 8I:
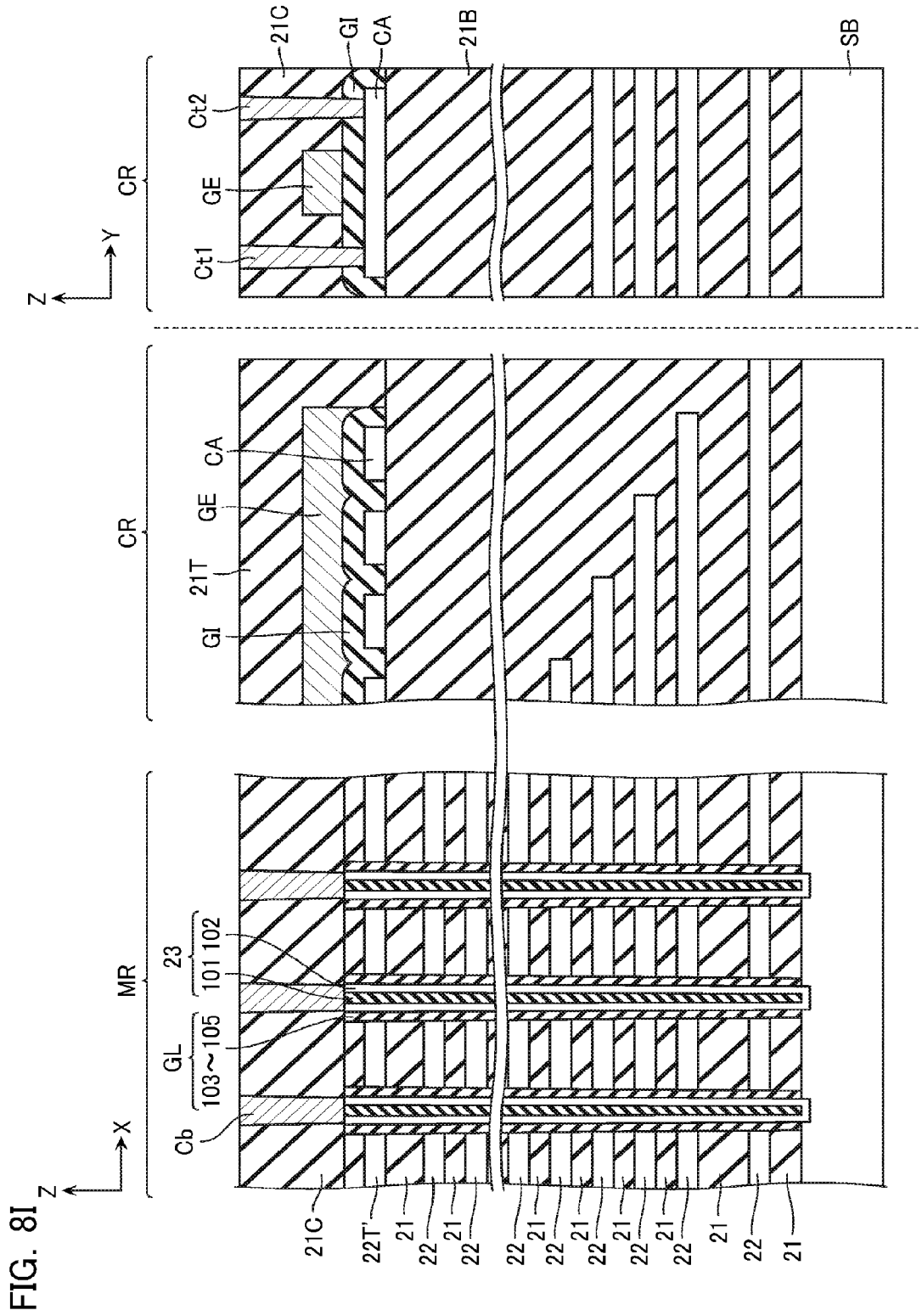
FIG. 8I is a process chart that explains a method of manufacturing the semiconductor memory device 100 according to the first embodiment.

Then, as shown in FIG. 8I, an interlayer insulating layer 21C including silicon oxide ($SiO_2$) is deposited on the upper part of the stacked body including the upper surfaces of the conductive layer 22T' and the conductive layer 24, using chemical vapor deposition or the like.

Thereafter, the structure of FIG. 6 is completed by forming previously-described contact plugs.

In this way, according to the semiconductor memory device of the first embodiment, the peripheral transistor Tr which connects various wirings to drive circuits are formed on the upper part of the stepwise wiring portion CR. Since the stepwise wiring portion CR and the peripheral transistors Tr positionally overlap in the XY plane, the peripheral transistors Tr do not have an additional occupied area in the XY plane. Accordingly, the substantial occupied area of the peripheral transistors Tr may be reduced. Accordingly, high integration of the device and downsizing can be achieved compared to the conventional device in which peripheral transistors are formed on a substrate SB.

In addition, the semiconductor memory device of the first embodiment has a structure in which the channel portion CA that constitutes a peripheral transistor Tr is located at the same position in the Z direction (height) as the drain side select gate line SGD.

According to such a structure, as compared to the conventional device in which peripheral transistors are formed on a substrate SB, the length of the contact plugs can be shortened, the processing depth for processing can be smaller, and the process cost can be reduced.

Second Embodiment

Figure 9:
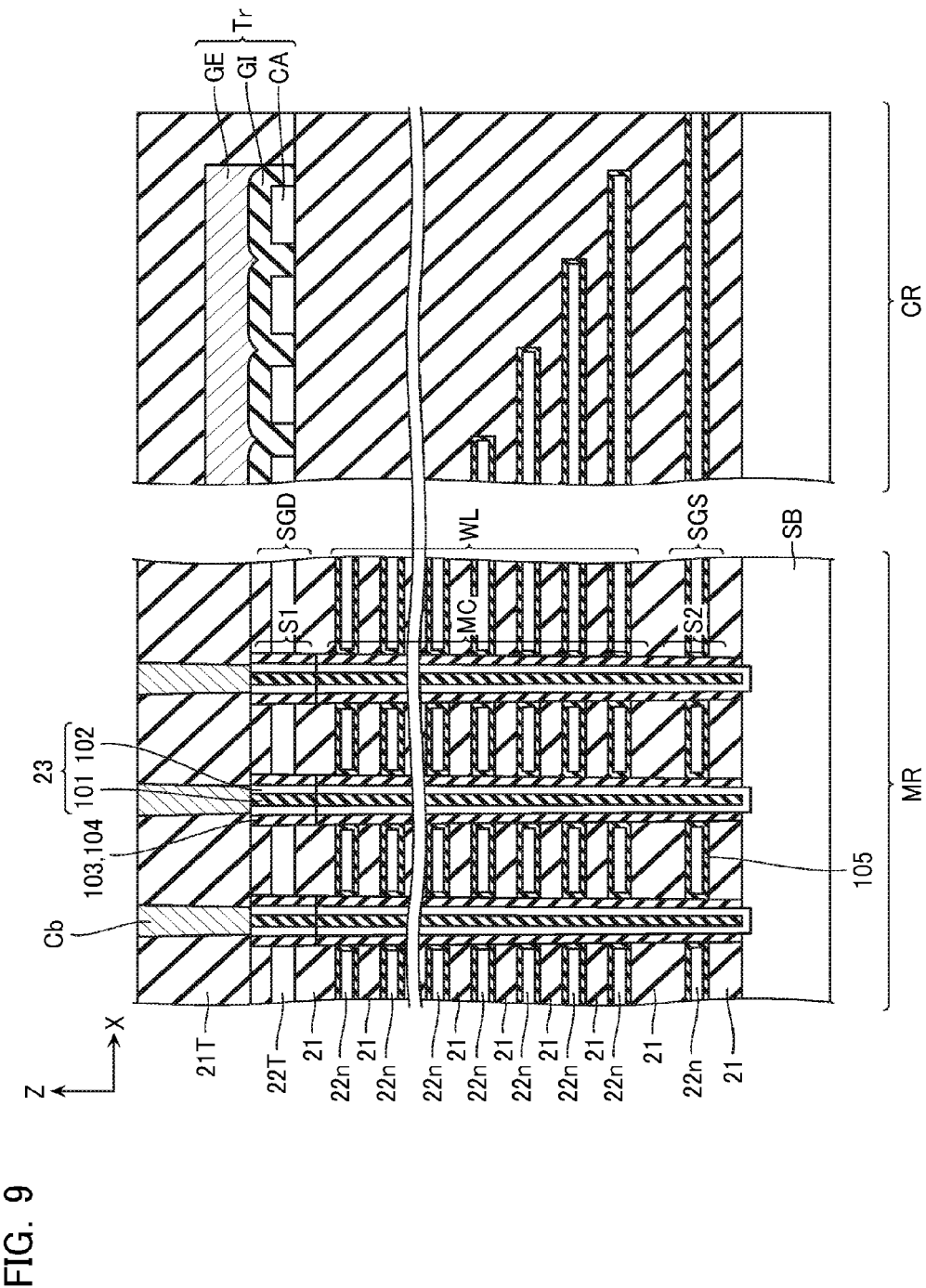
FIG. 9 is a sectional view of the memory cell array MR and a stepwise wiring portion CR of the semiconductor device according to the second embodiment.

Next, a semiconductor memory device according to the second embodiment will be described with reference to FIG. 9. FIG. 9 shows a sectional view of the memory cell array MR and the stepwise wiring portion CR of the semiconductor device of the second embodiment.

Figure 10:
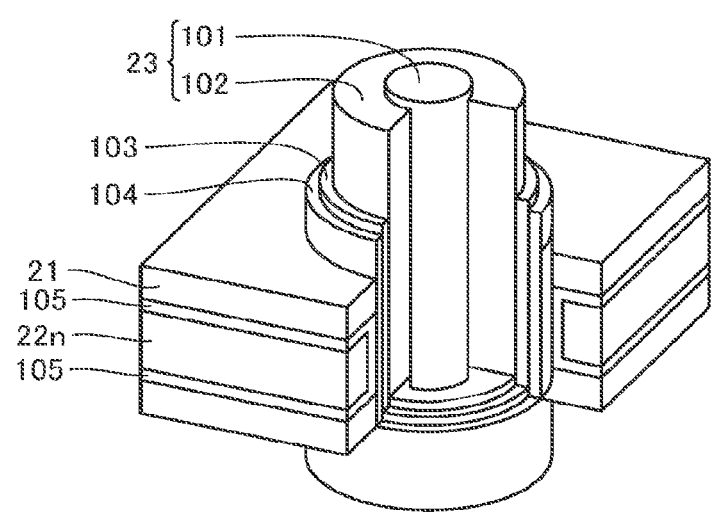
FIG. 10 is an enlarged perspective diagram of the memory cell MC of the semiconductor device according to the second embodiment.

In addition, FIG. 10 is an enlarged perspective diagram of the memory cell MC of the semiconductor device according to the second embodiment. Since the schematic structure of the device is substantially the same as that of the first embodiment, the overlapped explanation will be omitted.

This second embodiment is different from the first embodiment in that a conductive layer 22n is composed of a metallic material such as tungsten (W). In addition, unlike the first embodiment, the block insulating layer 105 is formed to surround the periphery of the conductive layers 22a.

Next, a method of manufacturing the semiconductor memory device according to the second embodiment will be described with reference to FIG. 11A to FIG. 11D. When the conductive layers 22n are composed of a metallic material as in the second embodiment, it is difficult to form the memory holes MH with high concentration. Accordingly, this second embodiment may be formed as described below. First, interlayer insulating layers and sacrifice layers are formed alternately. After the sacrifice layers are removed, the cavities formed after the removal of the sacrifice layers (air gaps) are embedded by conductive layers 22n including a metallic material.

Figure 11A:
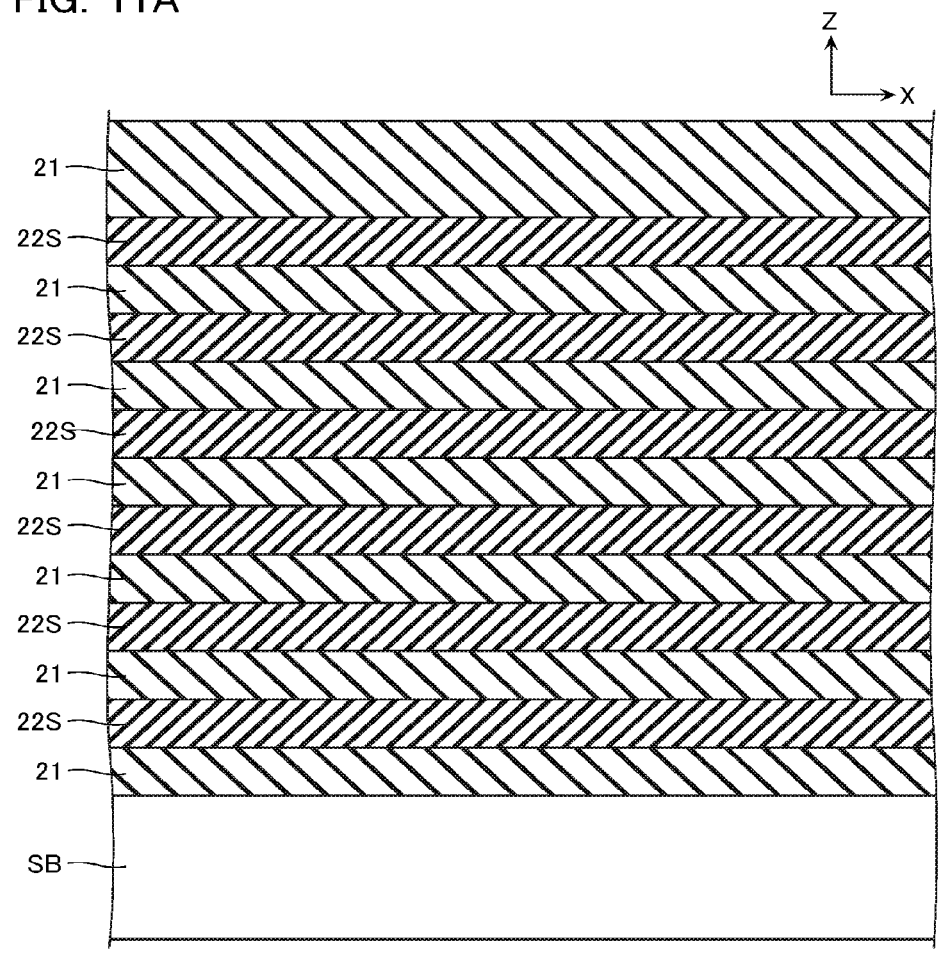
FIG. 11A is a process chart that explains a method of manufacturing the semiconductor memory device 100 according to the second embodiment.

Specifically, as shown in FIG. 11A, the interlayer insulating layers 21 are laminated on the semiconductor substrate SB, with the sacrifice layers 22S sandwiched therebetween. When the interlayer insulating layer 21 is a silicon nitride film, the sacrifice layer 22S may be formed of a silicon nitride film ($Si_3N_4$).

Figure 11B:
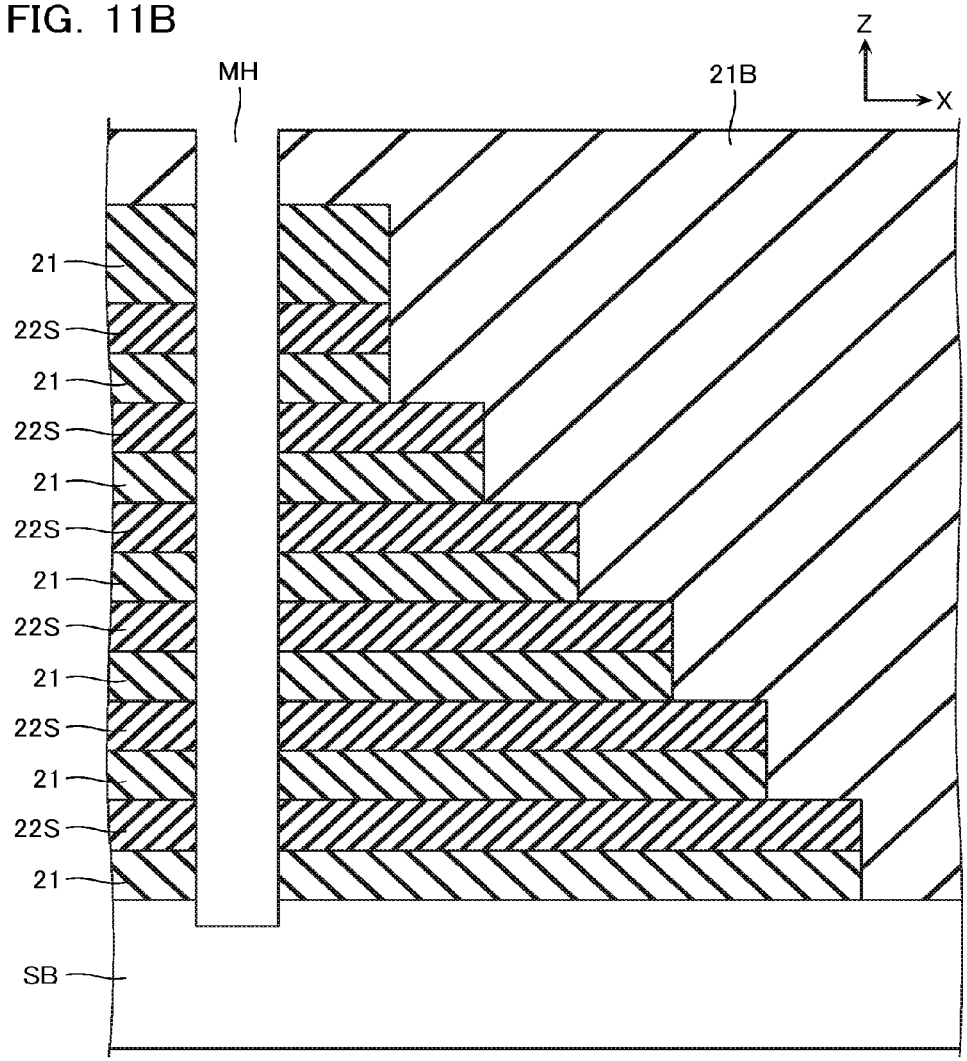
FIG. 11B is a process chart that explains a method of manufacturing the semiconductor memory device 100 according to the second embodiment.

Next, as shown in FIG. 11B, a step-like shape is provided at the end of the stacked body of the sacrifice layers 22S and the interlayer insulating layers 21 to forma stepwise wiring portion CR, similarly to the first embodiment. Subsequently, the interlayer insulating layer 21B is deposited to embed the stacked body subsequently. Then, on the part where the memory cell array MR shall be formed, the memory holes MH are formed similarly to the first embodiment.

Furthermore, as shown in FIG. 11C, the memory layer 104 and the tunnel insulating layer 103 are deposited on the sidewalls of the memory holes MH in this order, using plasma CVD or the like, to form the gate insulation layer GL. Then, the above-mentioned semiconductor layer 23 is formed to fill the inside of the memory holes MH, thereby the memory unit MU being formed.

After the memory unit MU is formed, RIE is performed to form trenches Tb (FIG. 5) that penetrate through the interlayer insulating layers 21 and the sacrifice layers 22S. Then, wet etching using the hot phosphoric acid solution is performed through the trenches Tb. This causes the sacrifice films 22S to be removed, as shown in FIG. 11D.

After the sacrifice films 22S are removed, air gap AG is formed therein. Then, to a wall surface of this air gap AG, the block insulating film 105 is formed to a certain film thickness using chemical vapor deposition, and then metal such as tungsten is embedded in the remained air gap AG, thereby the conductive layer 22n being completed. Thereafter, a structure of FIG. 9 is completed by performing the same process (FIGS. 8D-8I) as the first embodiment.

Third Embodiment

Then, a semiconductor memory device according to the third embodiment will be described with reference to FIG. 12 to FIG. 15. The entire structure including the memory cell array MR of the third embodiment is the same as the structure of the first embodiment (FIG. 1 to FIG. 5). However, in this third embodiment, the structure of the peripheral transistors Tr is different from that of the first embodiment.

Figure 12:
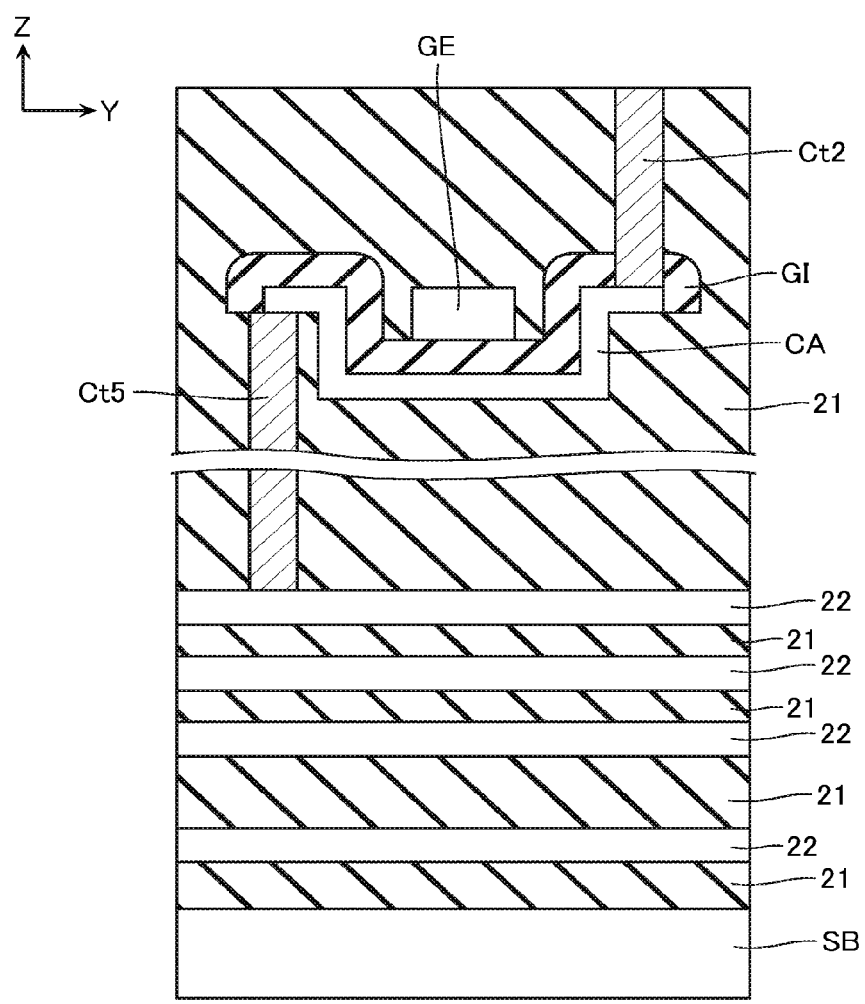
FIG. 12 is a sectional view of the stepwise wiring portion CR of the semiconductor device of the third embodiment.

FIG. 12 is a Z-Y sectional view that illustrates a structure of the peripheral transistor Tr according to the third embodiment, which corresponds to FIG. 7 of the first embodiment. Since components that are the same as those in FIG. 7 are assigned with identical reference numerals in FIG. 12, duplicated explanations are omitted here.

The peripheral transistor Tr of the third embodiment includes, in the Z-Y plane, a channel portion Ca which includes two conductive layers connected to contact plugs, and a portion that is connected between these conductive layers and is at a position lower than these conductive layers when seen from the substrate SB. For example, the channel portion CA has a concave portion or U-shape portion that projects into a lower direction (a direction toward the substrate SB of the Z direction).

The gate insulating film GI is formed along this channel portion. The gate electrode layer GE is located on this concave portion via the gate insulating film GI.

Although the gate electrode layer GE is formed on the upper surface of the gate insulating film GI in FIG. 12, it is possible that the gate electrode layer GE may be formed on the inner wall of the gate insulating film GI that is provided at the sidewall of the concave portion.

In addition, the contact plug Ct5 connected to the channel portion CA in FIG. 12 are arranged to extend from a lower part of the channel portion CA, along the Z direction, to reach the conductive layer 22. This is merely an example, and like an illustrated example in the first embodiment (FIG. 7), it is possible that the contact plug Ct5 may extend to the upper side along the Z direction from the upper surface of the channel portion CA to be connected to an upper wiring line.

Figure 13:
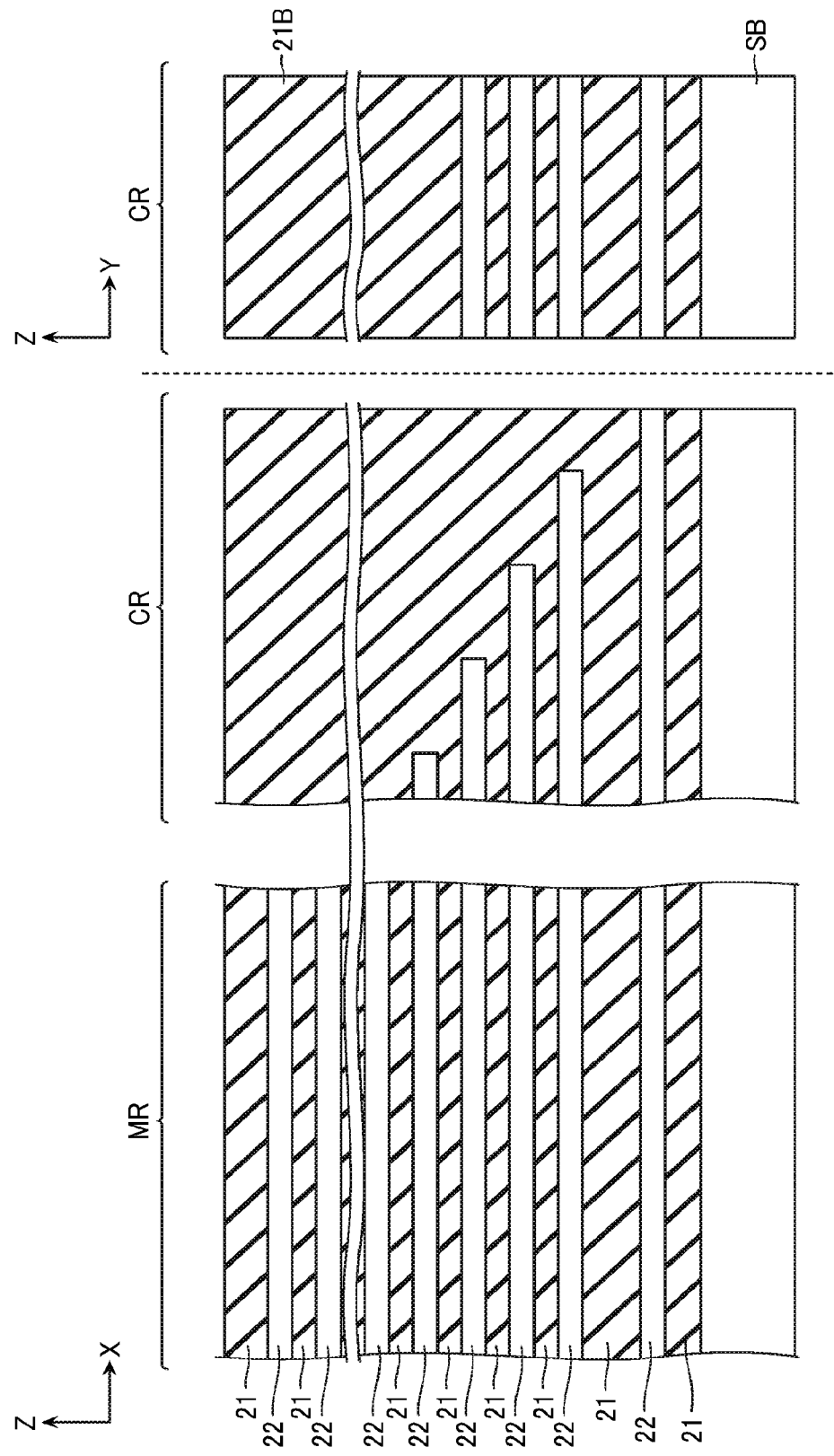
FIG. 13 is a process chart that explains a method of manufacturing the semiconductor memory device 100 according to the third embodiment.
Figure 14:
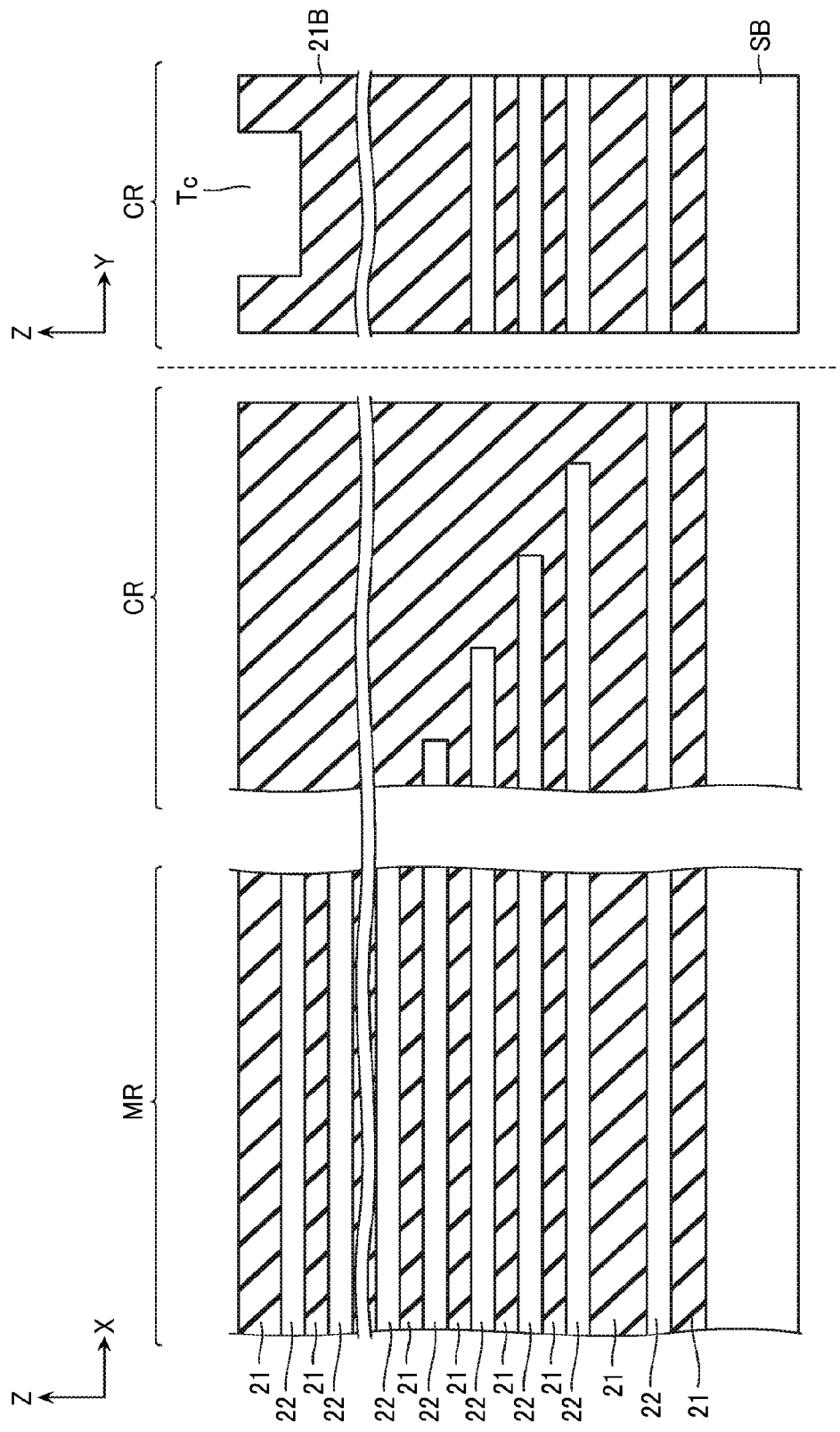
FIG. 14 is a process chart that explains a method of manufacturing the semiconductor memory device 100 according to the third embodiment.

Then, a method of producing the peripheral transistor Tr of the third embodiment will be described with reference to FIG. 13 to FIG. 15. At first, similarly to the first embodiment, a process shown in FIG. 8A to FIG. 8C is performed to obtain the structure shown in FIG. 13. Then, as shown in FIG. 14, a rectangular trench Tc that has its longitudinal direction along the X direction is formed by photolithography and etching. The rectangular trench Tc is formed on the uppermost interlayer insulating layer 21B in the stepwise wiring portion CR, at a position where the peripheral transistors Tr shall be shall be formed.

Figure 15:
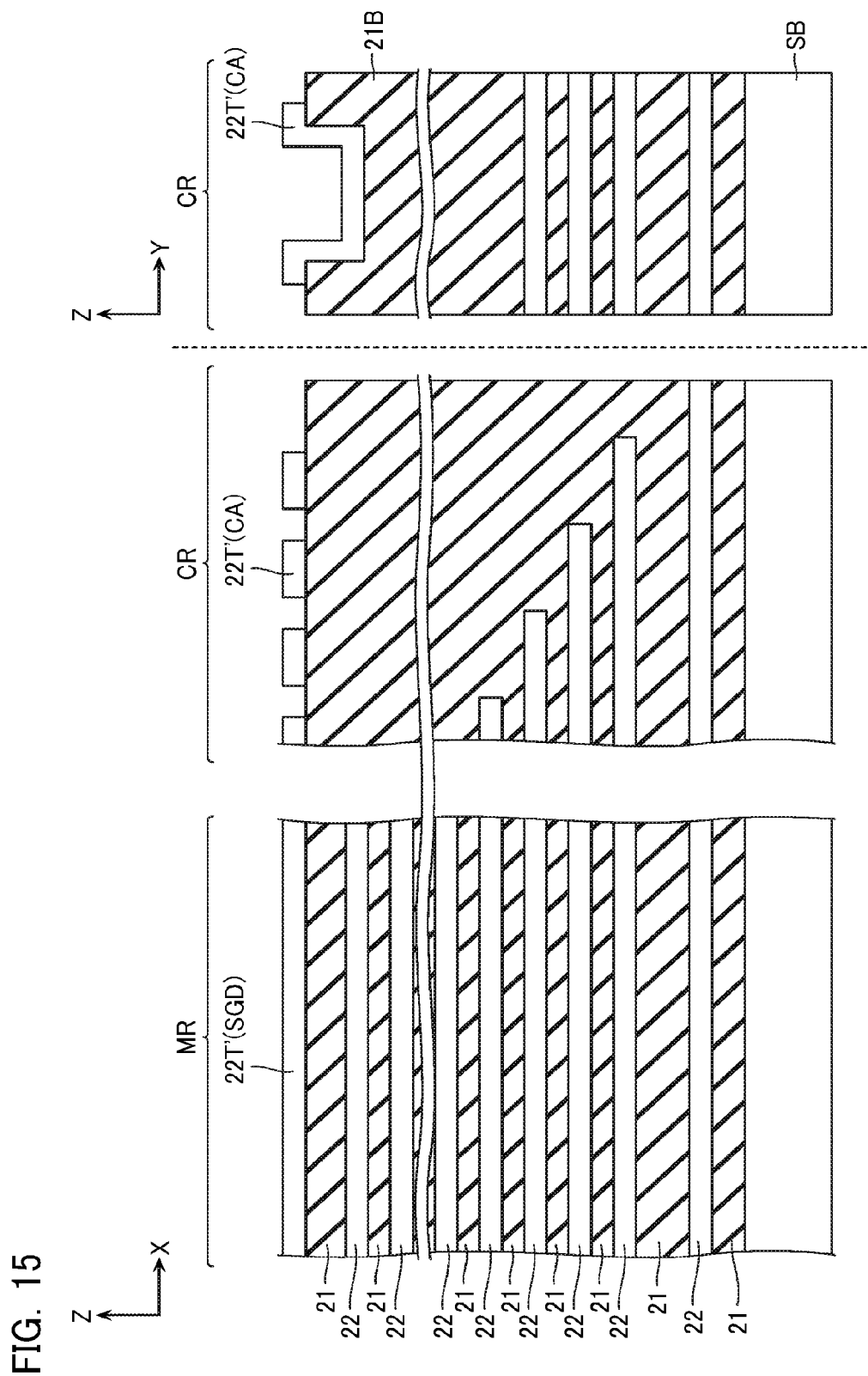
FIG. 15 is a process chart that explains a method of manufacturing the semiconductor memory device 100 according to the third embodiment.

Thereafter, as shown in FIG. 15, similarly to the first embodiment, the conductive layer 22T' is formed on the interlayer insulating layers 21 and 21B including the trench Tc. Similarly to the first embodiment, the conductive layer 22T' on the stepwise wiring portion CR is processed to a rectangular shape having its longitudinal direction along the Y direction. This allows the conductive layer 22T' to become the channel portion CA having a convex shape as shown in FIG. 12.

According to this third embodiment, a peripheral transistor Tr having a large channel length can be formed in a small occupied area. Accordingly, a large offset area may be provided. This improves the withstand voltage when a high voltage is applied to the gate electrode layer GE or the drain.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the above-mentioned embodiments relate to a semiconductor memory device. However, the present invention is generally applicable to semiconductor devices other than semiconductor memory devices. That is, the present invention is effectively applicable to semiconductor devices in which a plurality of conductive layers are laminated, and the conductive layers are formed to have a step-like shape.

What is claimed is:

1. A semiconductor device, comprising:
   a plurality of first conductive layers arranged in a first direction above a substrate, the first direction intersecting an upper surface of the substrate;
   a semiconductor layer that faces a side surface of the plurality of first conductive layers and extends in the first direction as a longitudinal direction thereof;
   a wiring portion configured by causing end portions of the first conductive layers to be at different positions, respectively; and
   a transistor located above the wiring portion,
   the transistor comprising:
   a channel portion arranged at a same height as a second conductive layer, the second conductive layer being one of the plurality of the first conductive layers;
   a gate insulating film arranged on an upper surface of the channel portion; and
   a gate electrode layer arranged on an upper surface of the gate insulating film.

2. The semiconductor device according to claim 1, wherein
   the channel portion has a thickness along the first direction that is approximately the same as that of the second conductive layer.

3. The semiconductor device according to claim 1, wherein
   the second conductive layer is arranged at the highest position, when seen from the substrate, among the plurality of the first conductive layers.

4. The semiconductor device according to claim 1, wherein
   the gate electrode layer and the second conductive layer include silicide of same metal.

5. The semiconductor device according to claim 1, wherein
   the channel portion is arranged so as to have a longitudinal direction thereof along a longitudinal direction of a stepwise portion of the wiring portion.

6. The semiconductor device according to claim 1, wherein
   the channel portion has a thickness along the first direction that is approximately the same as that of the second conductive layer, and
   the second conductive layer is a arranged at the highest position, when seen from the substrate, among the plurality of the first conductive layers.

7. The semiconductor device according to claim 6, wherein
   the gate electrode layer and the second conductive layer include silicide of same metal.

8. The semiconductor device according to claim 6, wherein
   the channel portion is arranged so as to have a longitudinal direction thereof along a longitudinal direction of a stepwise portion of the wiring portion.

9. The semiconductor device according to claim 3, wherein
   the first conductive layers except the second conductive layer are composed of a metallic material.

10. The semiconductor device according to claim 9, wherein
    the second conductive layer is composed of a semiconductor material.

11. The semiconductor device according to claim 9, wherein
    an insulating layer is formed to surround the periphery of the first conductive layers composed of the metallic material.

12. A semiconductor device, comprising:
    a plurality of first conductive layers arranged in a first direction above a substrate, the first direction intersecting an upper surface of the substrate;
    a semiconductor layer that faces a side surface of the plurality of first conductive layers and extends in the first direction as a longitudinal direction thereof;
    a wiring portion configured by causing end portions of the first conductive layers to be at different positions, respectively; and
    a transistor located above the wiring portion,
    the transistor comprises:
    third and fourth conductive layers arranged at a same height as a second conductive layer, the second conductive layer being one of the plurality of the first conductive layers;
    a channel portion provided between the third and fourth conductive layers and connected therebetween, the channel portion including a portion provided at a position lower than the third and fourth conductive layers seen from the substrate;
    a gate insulating film arranged at least on an upper surface of the channel portion; and
    a gate electrode layer arranged at least on an upper surface of the gate insulating film.

13. The semiconductor device according to claim 12, wherein
    the channel portion has a thickness along the first direction that is approximately the same as that of the second conductive layer.

14. The semiconductor device according to claim 12, wherein
    the second conductive layer is arranged at the highest position, when seen from the substrate, among the plurality of the first conductive layers.

15. The semiconductor device according to claim 12, wherein
    the gate electrode layer and the second conductive layer include silicide of same metal.

16. The semiconductor device according to claim 12, wherein
    the channel portion is arranged so as to have a longitudinal direction thereof along a longitudinal direction of a stepwise portion of the wiring portion.

17. The semiconductor device according to claim 14, wherein
    the first conductive layers except the second conductive layer are composed of a metallic material.

18. The semiconductor device according to claim 17, wherein
    The second conductive layer is composed of a semiconductor material.

19. The semiconductor device according to claim 17, wherein
    an insulating layer is formed to surround the periphery of the first conductive layers composed of the metallic material.

* * * * *